United States Patent
Higuchi

(10) Patent No.: US 12,407,334 B2
(45) Date of Patent: Sep. 2, 2025

(54) SIGNAL TRANSMISSION DEVICE, ELECTRONIC DEVICE, VEHICLE

(71) Applicant: ROHM CO., LTD., Kyoto (JP)

(72) Inventor: Toru Higuchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 181 days.

(21) Appl. No.: 18/018,409

(22) PCT Filed: Aug. 23, 2021

(86) PCT No.: PCT/JP2021/030759
§ 371 (c)(1),
(2) Date: Jan. 27, 2023

(87) PCT Pub. No.: WO2022/050102
PCT Pub. Date: Mar. 10, 2022

(65) Prior Publication Data
US 2023/0283266 A1 Sep. 7, 2023

(30) Foreign Application Priority Data
Sep. 3, 2020 (JP) .................................. 2020-148119

(51) Int. Cl.
*H03K 3/0233* (2006.01)
(52) U.S. Cl.
CPC ................. *H03K 3/02335* (2013.01)
(58) Field of Classification Search
CPC .. H03K 3/02335; H03K 17/18; H03K 17/689; H03K 19/017509; H03K 17/691;
(Continued)

(56) References Cited

U.S. PATENT DOCUMENTS

| 8,198,951 B2 | 6/2012 | Dong et al. |
| 2009/0213914 A1 | 8/2009 | Dong et al. |

(Continued)

FOREIGN PATENT DOCUMENTS

| DE | 102010013266 | 10/2010 | |
| EP | 1087333 A2 * | 3/2001 | ......... G06K 19/0723 |

(Continued)

OTHER PUBLICATIONS

International Search Report for PCT/JP2021/030759 dated Nov. 2, 2021, with English translation (5 pages).
(Continued)

*Primary Examiner* — Daniel D Chang
(74) *Attorney, Agent, or Firm* — Fish & Richardson P.C.

(57) ABSTRACT

For example, a signal transmission device includes a transmitter provided in a primary circuit system and configured to generate a transmission signal according to an input signal; at least one first isolating element configured to constitute a first signal transmission path for transmission of the transmission signal from the primary circuit system to the secondary circuit system; at least one second isolating element configured to constitute a second signal transmission path, different from the first signal transmission path, for transmission of the transmission signal from the primary circuit system to the secondary circuit system; and a receiver provided in the secondary circuit system and configured to feed a first reception signal and a second reception signal output respectively from the first and second isolating elements to a logic circuit to generate a single output signal.

14 Claims, 19 Drawing Sheets

(58) Field of Classification Search
CPC .. H04L 25/0266; H04L 27/02; H02M 1/0006; H02M 3/33523
See application file for complete search history.

(56) References Cited

U.S. PATENT DOCUMENTS

| | | | |
|---|---|---|---|
| 2010/0246646 A1* | 9/2010 | Gaalaas | H04L 25/0266 375/295 |
| 2014/0002168 A1* | 1/2014 | Yanagishima | H03K 17/723 327/296 |
| 2015/0180228 A1 | 6/2015 | Mills et al. | |
| 2017/0302225 A1* | 10/2017 | Kamath | H04L 25/0268 |
| 2022/0021562 A1* | 1/2022 | Khan | H04L 25/4902 |

FOREIGN PATENT DOCUMENTS

| | | |
|---|---|---|
| JP | 2012-257421 | 12/2012 |
| JP | 2018011108 | 1/2018 |

OTHER PUBLICATIONS

[No Author Listed], "Class D Audio Driver with Precision Dead-Time Generator," Silicon Laboratories Inc., Feb. 2011, 30 pages.

DE OA—German Patent Office, Office Action in German Appln. No. 112021003377.8, dated Jul. 23, 2024, 8 pages (with English Translation).

JP OA—Japanese Patent Office, Office Action in Japanese Appln. No. 2022-546243, dated Jul. 22, 2025, 9 pages (with English translation).

* cited by examiner

SIGNAL TRANSMISSION DEVICE, ELECTRONIC DEVICE, VEHICLE

CROSS REFERENCE TO RELATED APPLICATIONS

This application is a U.S. National Phase application under 35 U.S.C. § 371 of International Patent Application No. PCT/JP2021/030759, filed on Aug. 23, 2021, which claims the priority of Japanese Patent Application No. JP2020-148119, filed on Sep. 3, 2020, the disclosure of which is incorporated herein by reference in its entirety.

TECHNICAL FIELD

The invention disclosed herein relates to signal transmission devices, and to electronic devices and vehicles that employ signal transmission devices.

BACKGROUND ART

Some known signal transmission devices in practical use transmit an input pulse signal from a primary circuit system to, as an output pulse signal, a secondary circuit system while isolating between the primary and secondary circuit systems.

One example of known technology related to what has just been mentioned is seen in Patent Document 1 identified below.

CITATION LIST

Patent Literature

Patent Document 1: JP-A-2018-011108

SUMMARY OF INVENTION

Technical Problem

Inconveniently, known signal transmission devices are not quite satisfactory in terms of their fail-safe function in case of a fault in an isolating element.

In view of the inconvenience encountered by the present inventor, an object of the invention disclosed herein is to provide a signal transmission device that is less prone to failure in pulse signal transmission in case of a fault in an isolating element, and to provide an electronic device and a vehicle employing such a signal transmission device.

Solution to Problem

For example, according to what is disclosed herein, a signal transmission device includes: a transmitter provided in a primary circuit system and configured to generate a transmission signal according to an input signal; at least one first isolating element configured to constitute a first signal transmission path for transmission of the transmission signal from the primary circuit system to the secondary circuit system; at least one second isolating element configured to constitute a second signal transmission path, different from the first signal transmission path, for transmission of the transmission signal from the primary circuit system to the secondary circuit system; and a receiver provided in the secondary circuit system and configured to feed a first reception signal and a second reception signal output respectively from the first and second isolating elements to a logic circuit to generate a single output signal.

Other features, elements, steps, benefits, and characteristics of the present invention will become clear through the following detailed description of embodiments and the accompanying drawings associated therewith.

Advantageous Effects of Invention

According to the invention disclosed herein, it is possible to provide a signal transmission device that is less prone to failure in pulse signal transmission in case of a fault in an isolating element, and to provide an electronic device and a vehicle employing such a signal transmission device.

DESCRIPTION OF EMBODIMENTS

<Signal Transmission Device (Basic Configuration)>

Figure 1:
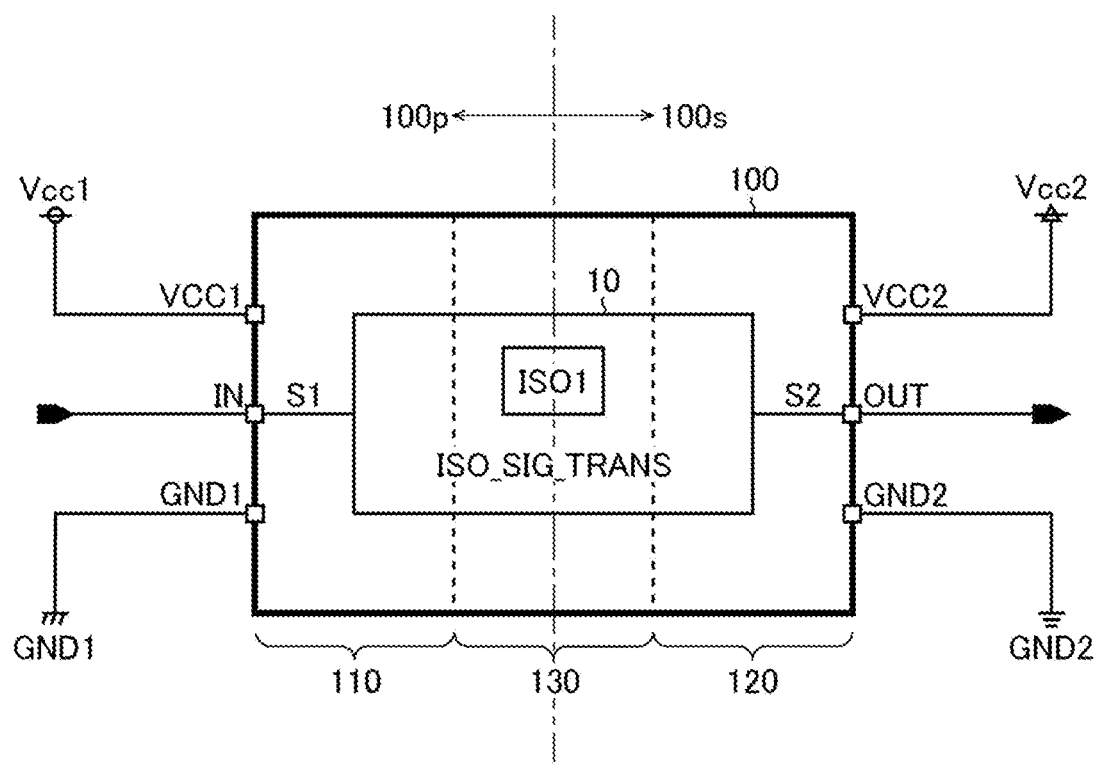
FIG. 1 is a diagram showing an example of the basic configuration of a signal transmission device.

FIG. 1 is a diagram showing an example of the basic configuration of a signal transmission device. The signal transmission device 100 of this configuration example is a semiconductor integrated circuit device (what is generally called an isolated gate driver IC) that, while isolating between a primary circuit system 100p (Vcc1-GND1 system) and a secondary circuit system 100s (Vcc2-GND2 system), transmits a pulse signal from the primary circuit system 100p to the secondary circuit system 100s to drive the gate of a power transistor (unillustrated) provided in the secondary circuit system 100s The signal transmission device 100 has a plurality of external terminals as means for establishing electrical connection with outside the device (in FIG. 1 appear a VCC1 pin, an IN pin, a GND1 pin, a VCC2 pin, an OUT pin, and a GND2 pin).

In the primary circuit system 100p, the VCC1 pin (primary power terminal) is connected to a power line of the primary circuit system 100p (i.e., an application terminal for a supply voltage Vcc1). The IN pin (pulse signal input terminal) is connected to an input pulse signal source (such as an ECU [electronic control circuit]; not shown). The GND1 pin (primary ground terminal) is connected to a ground line of the primary circuit system 100p (i.e., an application terminal for a ground voltage GND1).

In the secondary circuit system 100s, the VCC2 pin (secondary power terminal) is connected to a power line of the secondary circuit system 100s (i.e., an application terminal for a supply voltage Vcc2). The OUT pin (pulse signal output terminal) is connected to the gate of an unillustrated power transistor. The GND2 pin is connected to a ground line of the secondary circuit system 100s (i.e., an application terminal for a ground voltage GND2).

The signal transmission device 100 can be used widely in applications in general (such as motor drivers and DC/DC converters that handle high voltages) that require signal transmission between a primary circuit system 100p and a secondary circuit system 100s while isolating between these.

Referring still to FIG. 1, the internal configuration of the signal transmission device 100 will be described. The signal transmission device 100 of this configuration example includes a controller chip 110 (corresponding to a first chip), a driver chip 120 (corresponding to a second chip), and a transformer chip 130 (corresponding to a third chip).

The controller chip 110 is a semiconductor chip that has integrated on it the circuit elements of the primary circuit system 100p that operate by being supplied with the supply voltage Vcc1 (e.g., seven volts at the maximum with reference to GND1). The driver chip 120 is a semiconductor chip that has integrated on it the circuit elements of the secondary circuit system 100s that operate by being supplied with the supply voltage Vcc2 (e.g., 30 volts at the maximum with reference to GND2). The transformer chip 130 is a semiconductor chip that has integrated on it a transformer for bidirectional signal transfer between the controller chip 110 and the driver chip 120 while isolating between these.

As described above, the signal transmission device 100 of this configuration example has, separately from the controller chip 110 and the driver chip 120, the transformer chip 130 that incorporates a transformer alone, and these three chips are sealed in a single package.

With this configuration, the controller chip 110 and the driver chip 120 can each be formed by a common low- to middle-withstand-voltage process (with a withstand voltage of several volts to several tens of volts). This eliminates the need for a dedicated high-withstand-voltage process (with a withstand voltage of several kilovolts), and helps reduce manufacturing costs.

Moreover, the controller chip 110 and the driver chip 120 can each be fabricated by a time-proven existing process. This eliminates the need for conducting reliability tests anew, and contributes to a shortened development period and reduced development costs.

Moreover, use of an isolating element other than a transformer (e.g., a capacitor or a photocoupler) can be coped with easily by solely mounting the alternative in place of the transformer chip 130. This eliminates the need for re-developing the controller chip 110 and the driver chip 120, and contributes to a shortened development period and reduced development costs.

The signal transmission device 100 includes, as a principal functional block, an isolated signal transmission circuit 10.

Via a first isolating element ISO1 (such as a transformer) integrated on the transformer chip 130, the isolated signal transmission circuit 10 transmits a pulse signal from the primary circuit system 100p to the secondary circuit system 100s while isolating between the primary circuit system 100p and the secondary circuit system 100s. In terms of what is shown in FIG. 1, the isolated signal transmission circuit 10 operates such that an input pulse signal S1 that is fed in to the IN pin of the primary circuit system 100p is transmitted as an output pulse signal S2 that is fed out from the OUT pin of the secondary circuit system 100s.

The circuit elements of the isolated signal transmission circuit 10 are integrated in a distributed manner among the controller chip 110, the driver chip 120, and the transformer chip 130.

<Isolated Signal Transmission Circuit>

Figure 2:
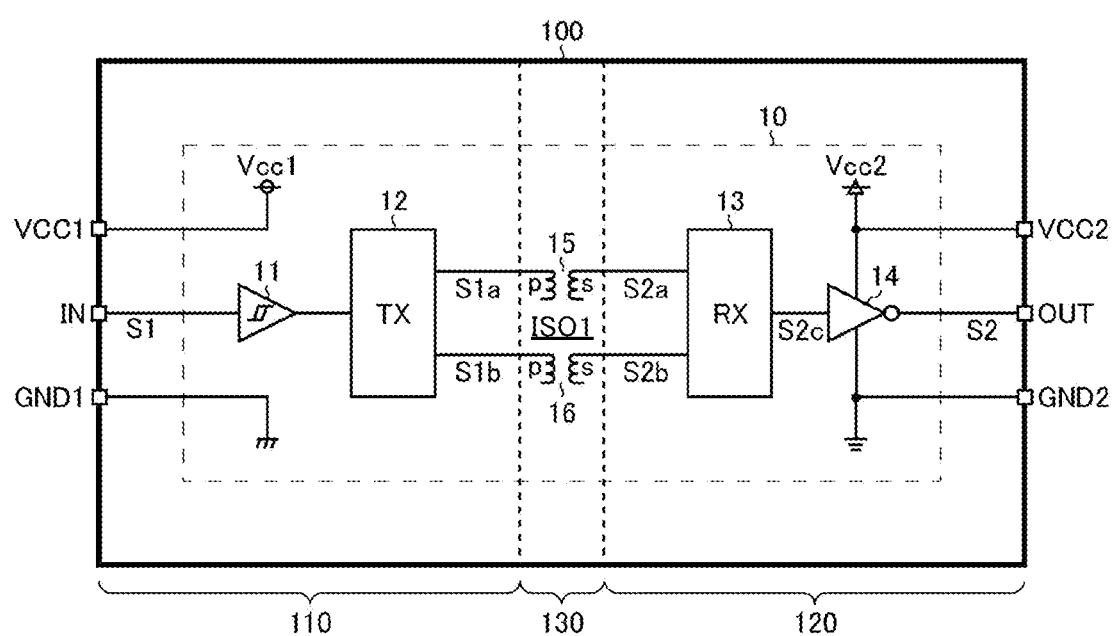
FIG. 2 is a diagram showing an example of the basic configuration of an isolated signal transmission circuit.

FIG. 2 is a diagram showing an example of the basic configuration of the isolated signal transmission circuit 10. The isolated signal transmission circuit 10 of this configuration example includes a Schmitt buffer 11, a pulse transmitter 12, a pulse receiver 13, a driver 14, and transformers 15 and 16 (corresponding to the first isolating element ISO1 mentioned above).

The Schmitt buffer 11 is one example of a waveform shaper, and is connected between the IN pin and the pulse transmitter 12.

The pulse transmitter 12 pulse-drives either a transmission pulse signal S1a or a transmission pulse signal S1b according to the logic level of the input pulse signal S1, which is fed to the pulse transmitter 12 from the IN pin via the Schmitt buffer 11. For example, when indicating that the input pulse signal S1 is at high level, the pulse transmitter 12 pulse-drives (outputs a single or a plurality of transmission pulses in) the transmission pulse signal S1a, which is applied to the primary winding 15p of the transformer 15; when indicating that the input pulse signal S1 is at low level, the pulse transmitter 12 pulse-drives the transmission pulse signal S1b, which is applied to the primary winding 16p of the transformer 16.

The Schmitt buffer 11 and the pulse transmitter 12 mentioned above are both integrated on the controller chip 110 in the primary circuit system 100p (Vcc1-GND1 system).

The pulse receiver 13 generates a reception pulse signal S2c according to reception pulse signals S2a and S2b, which are fed to the pulse receiver 13 from the transformers 15 and 16 respectively. For example, on detecting an induced pulse in the reception pulse signal S2a that appears in the secondary winding 15s of the transformer 15 as a result of the transmission pulse signal S1a being pulse-driven, the pulse receiver 13 drops the reception pulse signal S2c to low level; on the other hand, on detecting an induced pulse in the reception pulse signal S2b that appears in the secondary winding 16s of the transformer 16 as a result of the transmission pulse signal S1b being pulse-driven, the pulse receiver 13 raises the reception pulse signal S2c to high level The driver 14 generates an output pulse signal S2 (corresponding to the gate signal for an unillustrated power transistor) according to the reception pulse signal S2c fed to it from the pulse receiver 13. For example, in a case where the driver 14 is implemented with an inverter, when the reception pulse signal S2c is at low level, the output pulse signal S2 is at high level; when the reception pulse signal S2c is at high level, the output pulse signal S2 is at low level. Thus, the logic level of the output pulse signal S2 switches according to the logic level of the input pulse signal S1.

The pulse receiver 13 and the driver 14 mentioned above are both integrated on the driver chip 120 in the secondary circuit system 100s (Vcc2-GND2 system).

According to the transmission pulse signal S1a fed to the primary winding 15p, the transformer 15 outputs the reception pulse signal S2a from the secondary winding 15s. On the other hand, according to the transmission pulse signal S1b fed to the primary winding 16p, the transformer 16 outputs the reception pulse signal S2b from the secondary winding 16s.

The transformers 15 and 16 are both integrated on the transformer chip 130. While isolating between the controller chip 110 and the driver chip 120 using the transformers 15 and 16, the transformer chip 130 outputs the transmission pulse signals S1a and S1b fed to it from the pulse transmitter 12 to, as the reception pulse signals S2a and S2b respectively, the pulse receiver 13.

As described above, owing to the characteristics of spiral coils used in isolated communication, the input pulse signal S1 is split into two transmission pulse signals S1a and S1b (corresponding to a rise signal and a fall signal) to be transmitted via the transformers 15 and 16, that is, across two channels, from the primary circuit system 100p to the secondary circuit system 100s.

<Isolated Signal Transmission Operation>

Figure 3:
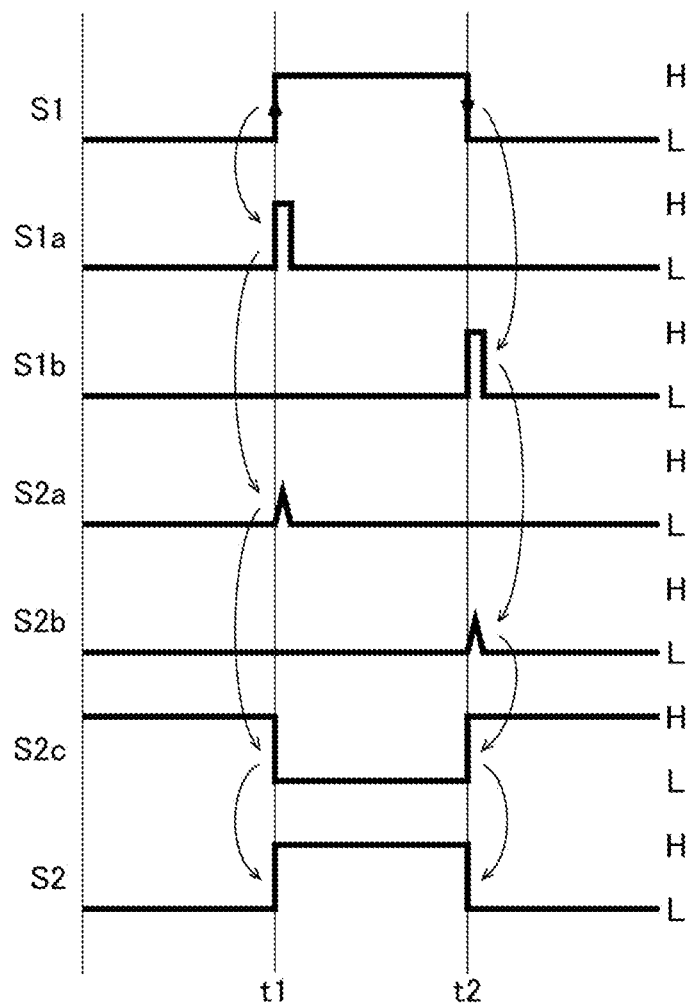
FIG. 3 is a diagram showing a first example (in normal condition) of isolated signal transmission operation.

FIG. 3 is a diagram showing a first example (in normal condition) of the isolated signal transmission operation by the isolated signal transmission circuit 10, depicting, from top down, the input pulse signal S1, the transmission pulse signals S1a and S1b, the reception pulse signals S2a to S2c, and the output pulse signal S2. In the diagram, for the sake of convenience, signal delays are omitted from depiction.

At a rising edge in the input pulse signal S1 at time point t1, the pulse transmitter 12 pulse-drives the transmission pulse signal Sla; at a falling edge in the input pulse signal S1 at time point t2, the pulse transmitter 12 pulse-drives the transmission pulse signal S1b. On detecting an induced pulse in the reception pulse signal S2a resulting from the transmission pulse signal S1a being pulse-driven, the pulse receiver 13 drops the reception pulse signal S2c to low level; on detecting an induced pulse in the reception pulse signal S2b resulting from the transmission pulse signal S1b being pulse-driven, the pulse receiver 13 raises the reception pulse signal S2c to high level. As a result, when the input pulse signal S1 rises to high level, the output pulse signal S2 rises to high level accordingly; when the input pulse signal S1 falls to low level, the output pulse signal S2 falls to low level accordingly.

A drawback with the isolated signal transmission circuit 10 of the basic configuration example (FIG. 2) is that, with the first isolating element ISO1 (transformer 15 or 16) at fault, the input pulse signal S1 can no longer be transmitted as the output pulse signal S2.

Figure 4:
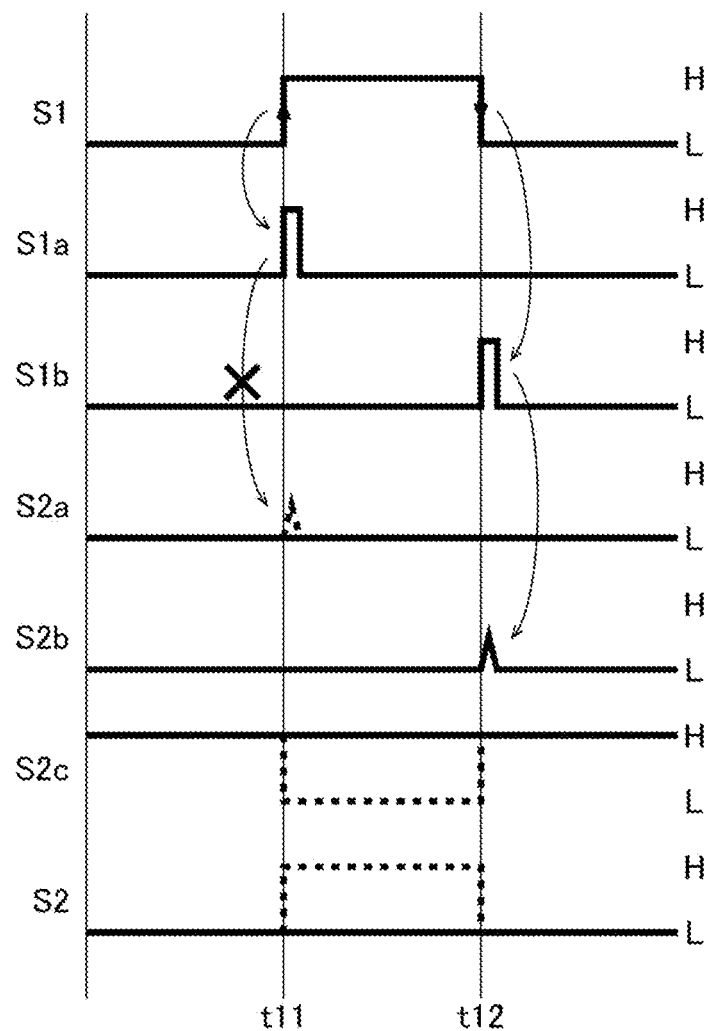
FIG. 4 is a diagram showing a second example (in set-fault condition) of isolated signal transmission operation.

FIG. 4 is a diagram showing a second example (in set-fault condition) of the isolated signal transmission operation by the isolated signal transmission circuit 10, depicting, like FIG. 3 referred to previously, from top down, the input pulse signal S1, the transmission pulse signals S1a and S1b, the reception pulse signals S2a to S2c, and the output pulse signal S2. In the diagram, for the sake of convenience, signal delays are omitted from depiction.

For example, if the transformer 15 is at fault, even when, at time point t11, the input pulse signal S1 rises to high level and the transmission pulse signal S1a is pulse-driven, no induced pulse appears in the reception pulse signal S2a. As a result, the reception pulse signal S2c does not fall to low level, and hence the output pulse signal S2 does not rise to high level.

Figure 5:
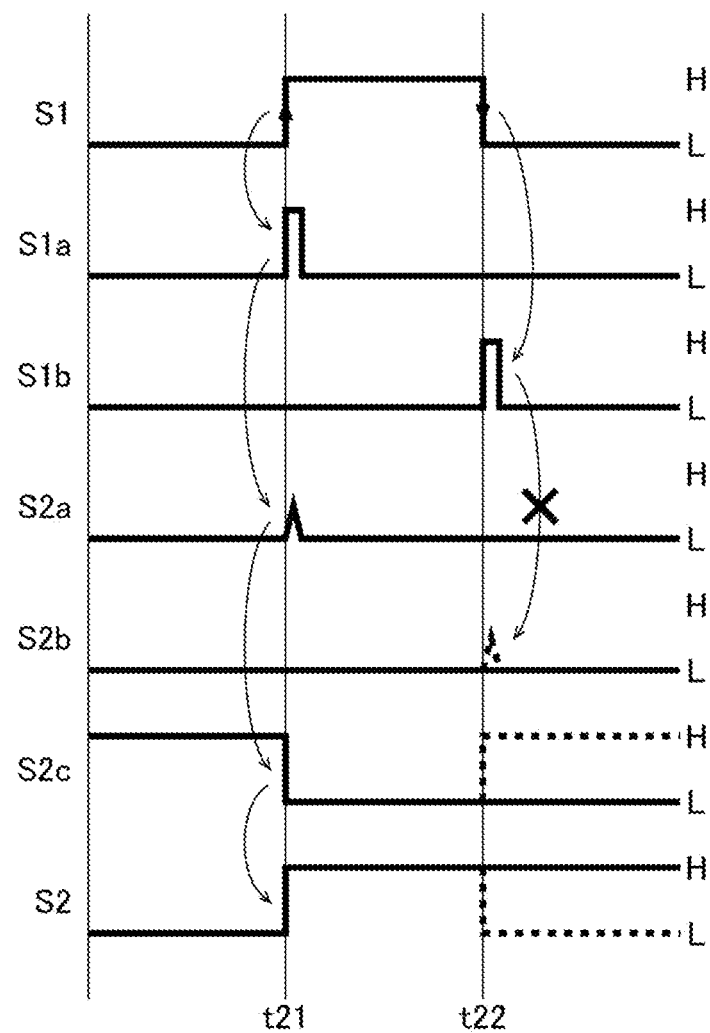
FIG. 5 is a diagram showing a third example (in reset-fault condition) of isolated signal transmission operation.

FIG. 5 is a diagram showing a third example (in rest-fault condition) of the isolated signal transmission operation by the isolated signal transmission circuit 10, depicting, like FIG. 3 referred to previously, from top down, the input pulse signal S1, the transmission pulse signals S1a and S1b, the reception pulse signals S2a to S2c, and the output pulse signal S2. In the diagram, for the sake of convenience, signal delays are omitted from depiction.

For example, if the transformer 16 is at fault, even when, at time point t22, the input pulse signal S1 falls to low level and the transmission pulse signal S1b is pulse-driven, no induced pulse appears in the reception pulse signal S2b. As a result, the reception pulse signal S2c does not rise to low level, and hence the output pulse signal S2 does not fall to low level.

As described above, a fault in the first isolating element ISO1 and the resulting failure of signal transmission from the primary circuit system 100p to the secondary circuit system 100s adversely affect the driving of a load provided in the secondary circuit system 100s. For example, in a case where the signal transmission device 100 is used as a means for driving a motor incorporated in a vehicle (in particular, an electric-powered vehicle such as an electric car or hybrid car), control signals from an ECU are not transmitted to a power transistor, and a motor or the like connected to the power transistor is left uncontrollable. This impairs the basic safety mechanisms of the vehicle such as those involved in running, stopping, and otherwise controlling it, and thus may lead to serious accidents.

In particular, the first isolating element ISO1, which isolates between the primary circuit system 100p (Vcc1-GND1 system) and the secondary circuit system 100s (Vcc2-GND2 system), is used under conditions where it is exposed to a strong electric field and is prone to break down. Thus, it is crucial to have a fail-safe function that can cope with the first isolating element ISO1 at fault.

With what has been studied above in mind, a signal transmission device 100 that is less prone to failure in pulse signal transmission in case of a fault in an isolating element will be presented.

<Signal Transmission Device (First Embodiment)>

Figure 6:
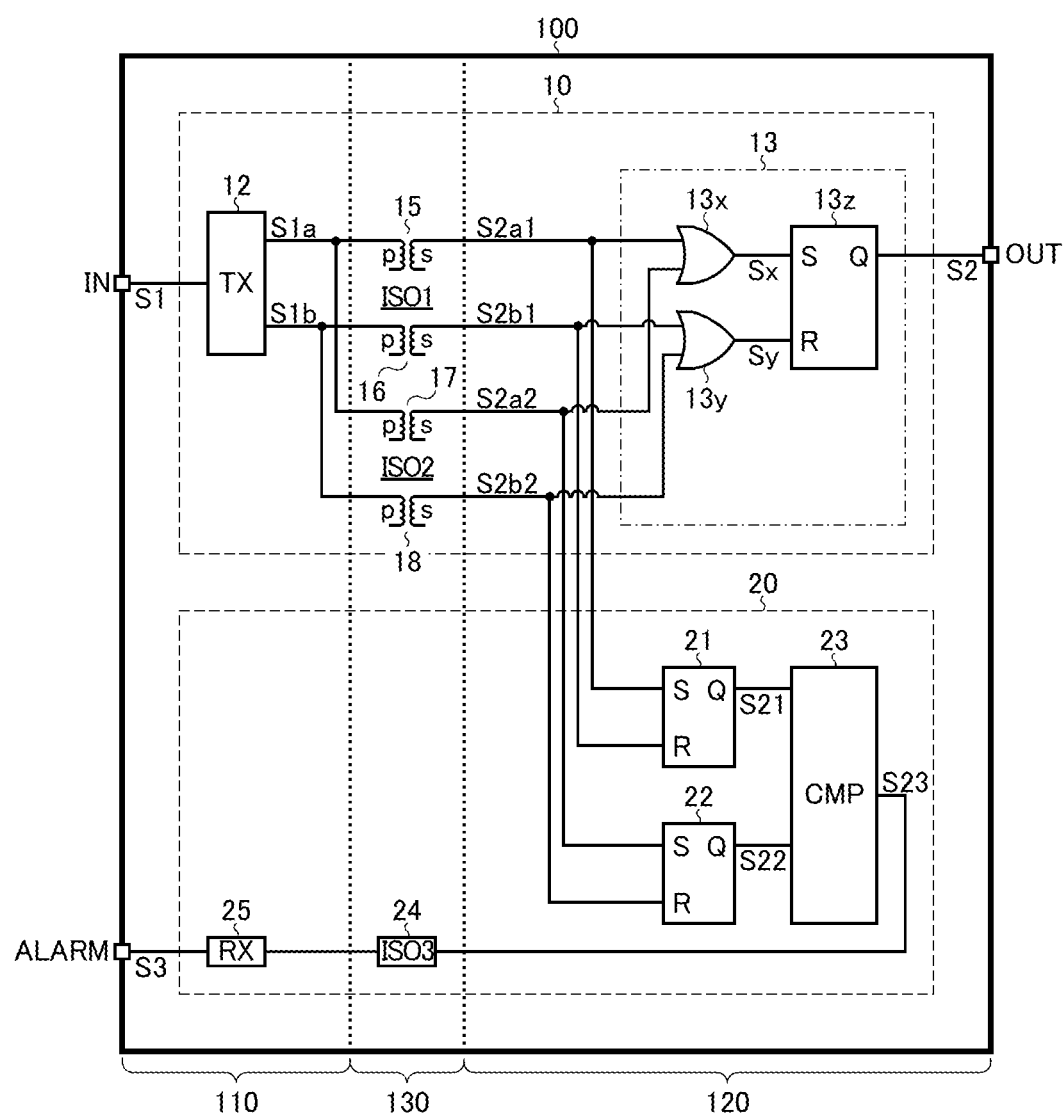
FIG. 6 is a diagram showing a signal transmission device according to a first embodiment.

FIG. 6 is a diagram showing a signal transmission device 100 according to a first embodiment. While the signal transmission device 100 according to the first embodiment is based on the basic configuration example (FIGS. 1 and 2) described previously, the isolated signal transmission circuit 10 here is additionally provided with a fail-safe function that employs a plurality of isolating elements and, separately from that, a fault indication circuit 20 is additionally provided. Note that, in the diagram, the Schmitt buffer 11 and the driver 14 described previously are omitted from illustration.

First, a detailed description will be given of an isolated signal transmission circuit 10 provided with a fail-safe function. The isolated signal transmission circuit 10 according to this embodiment includes, in addition to a first isolating element ISO1 (transformers 15 and 16), a second isolating element ISO2 (transformers 17 and 18).

The transformer 15 outputs, according to a transmission pulse signal S1$a$ fed to the primary winding 15$p$, a reception pulse signal S2$al$ from the secondary winding 15$s$. The transformer 16 outputs, according to a transmission pulse signal S1$b$ fed to the primary winding 16$p$, a reception pulse signal S2$b$1 from the secondary winding 16$s$.

The transformer 17 outputs, according to the transmission pulse signal S1$a$ fed to the primary winding 17$p$, a reception pulse signal S2$a$2 from the secondary winding 17$s$. The transformer 18 outputs, according to the transmission pulse signal S1$b$ fed to the primary winding 18$p$, a reception pulse signal S2$b$2 from the secondary winding 18$s$.

Note that, in the signal transmission device 100 according to this embodiment, the transformers 15 to 18 mentioned above are all integrated in a consolidated manner on a single transformer chip 130.

The pulse receiver 13 includes two OR gates 13$x$ and 13$y$ and one RS flip-flop 13$z$.

The OR gate 13$x$ generates the OR signal Sx of the reception pulse signal S2$al$, which appears in the secondary winding 15$s$ of the transformer 15, and the reception pulse signal S2$a$2, which appears in the secondary winding 17$s$ of the transformer 17. The OR signal Sx is at high level when at least either of the reception pulse signals S2$al$ and S2$a$2 is at high level, and is at low level when the reception pulse signals S2$al$ and S2$a$2 are both at low level.

The OR gate 13$y$ generates the OR signal Sy of the reception pulse signal S2$b$1, which appears in the secondary winding 16$s$, of the transformer 16, and the reception pulse signal S2$b$2, which appears in the secondary winding 18$s$ of the transformer 18. The OR signal Sy is at high level when at least either of the reception pulse signals S2$b$1 and S2$b$2 is at high level, and is at low level when the reception pulse signals S2$b$1 and S2$b$2 are both at low level.

A waveform shaper such as a Schmitt buffer may be provided in the stage preceding each of the OR gates 13$x$ and 13$y$.

The RS flip-flop 13$z$ switches the logic level of the output pulse signal S2, which it outputs from its output terminal (Q), according to the OR signal Sx, which is fed to the set terminal(S) of the RS flip-flop 13$z$, and the OR signal Sy, which is fed to the reset terminal (R) of the RS flip-flop 13$z$. For example, when the OR signal Sx rises to high level, the RS flip-flop 13$z$ sets the output pulse signal S2 to high level; when the OR signal Sy rises to high level, the RS flip-flop 13$z$ resets the output pulse signal S2 to low level. While, in FIG. 6, the output terminal (Q) of the RS flip-flop 13$z$ is shown to be connected directly to the OUT pin, a driver 14 such as an inverter or buffer may be provided midway.

As described above, the signal transmission device 100 (in particular, the isolated signal transmission circuit 10) according to the first embodiment includes: a pulse transmitter 12 provided in a primary circuit system 100$p$ and configured to generate transmission pulse signals S1$a$ and S1$b$ according to an input pulse signal S1; at least one first isolating element ISO1 (transformers 15 and 16) configured to constitute a first signal transmission path for transmission of the transmission pulse signal S1$a$ from the primary circuit system 100$p$ to a secondary circuit system 100$s$; at least one second isolating element ISO2 (transformers 17 and 18) configured to constitute a second signal transmission path, different from the first transmission pass mentioned above, for transmission of the transmission pulse signal S1$b$ from the primary circuit system 100$p$ to the secondary circuit system 100$s$; and a pulse receiver 13 provided in the secondary circuit system 100$s$ and configured to generate a single output pulse signal S2 by feeding first reception pulse signals (S2$al$ and S2$b$1) and second reception pulse signals (S2$a$2 and S2$b$2) output respectively from the first and second isolating elements ISO1 and ISO2 to a logic circuit (OR gates 13$x$ and 13$y$ and an RS flip-flop 13$z$).

The pulse receiver 13 may include, as the logic circuit mentioned above, a combinational circuit (such as an OR AND gate) that determines an output based on current inputs and a sequential circuit (such as an RS flip-flop or D flip-flop) that determines an output based on past inputs.

Thus, even if either of the first and second isolating elements ISO1 and ISO2 is at fault, so long as the other is operating normally, the input pulse signal S1 to the primary circuit system 100$p$ can be transmitted as the output pulse signal S2 from the secondary circuit system 100$s$, with no adverse effect on the driving of a load provided in the secondary circuit system 100$s$. For example, in a case where the signal transmission device 100 is used as a means for driving a motor incorporated in a vehicle (in particular, an electric-powered vehicle such as an electric car or hybrid car), control signals from an ECU can be transmitted to a power transistor properly, a motor or the like connected to the power transistor can continue being controlled. This helps maintain the basic safety mechanisms of the vehicle such as those involved in running, stopping, and otherwise controlling it, and thus helps avoid serious accidents.

The isolated signal transmission circuit 10 may incorporate three or more isolating elements. That is, three or more channels of signal transmission paths may be provided for the transmission of each of the transmission pulse signals S1$a$ and S1$b$ from the primary circuit system 100$p$ to the secondary circuit system 100$s$.

Next, a description will be given of the additionally provided fault indication circuit 20. The fault indication circuit 20 is a circuit block that monitors both the first reception pulse signals (S2$al$ and S2$b$1) and the second reception pulse signals (S2$a$2 and S2$b$2) to generate an alarm signal S3 that indicates a fault in either of the first and second isolating elements ISO1 and ISO2. The fault indication circuit 20 includes RS flip-flops 21 and 22, a signal comparator 23, an isolating element 24 (corresponding to a third isolating element ISO3), and a pulse receiver 25.

The RS flip-flop 21 (corresponding to a first sequential circuit) switches the logic level of a virtual output pulse signal S21 that it outputs from its output terminal (Q) according to the reception pulse signal S2$al$, which is fed to the set terminal(S) of the RS flip-flop 21, and the reception pulse signal S2$b$1, which is fed to the reset terminal (R) of the RS flip-flop 21. For example, when the reception pulse signal S2$al$ rises to high level, the RS flip-flop 21 sets the virtual output pulse signal S21 to high level; when the reception pulse signal S2$b$1 rises to high level, the RS flip-flop 21 resets the virtual output pulse signal S21 to low level.

The RS flip-flop 22 (corresponding to a second sequential circuit) switches the logic level of a virtual output pulse signal S22 that it outputs from its output terminal (Q) according to the reception pulse signal S2$a$2, which is fed to the set terminal(S) of the RS flip-flop 22, and the reception pulse signal S2$b$2, which is fed to the reset terminal (R) of the RS flip-flop 22. For example, when the reception pulse signal S2$a$2 rises to high level, the RS flip-flop 22 sets the virtual output pulse signal S22 to high level; when the reception pulse signal S2b2 rises to high level, the RS flip-flop 22 resets the virtual output pulse signal S22 to low level.

The signal comparator 23 compares the virtual output pulse signals S21 and S22 to output a comparison pulse signal S23 that indicates whether the two signals coincide or not. For example, when the virtual output pulse signals S21 and S22 coincide, the comparison pulse signal S23 is at low level (i.e., the logic level indicating normal condition); when the virtual output pulse signals S21 and S22 do not coincide, the comparison pulse signal S23 is at high level (i.e., the logic level indicating faulty condition).

In a case where the isolated signal transmission circuit 10 incorporates three or more isolating elements, when all the virtual output pulse signals coincide, the comparison pulse signal S23 can be kept at low level (i.e., the logic level indicating normal condition), and when any of the virtual output pulse signals do not coincide, the comparison pulse signal S23 can be kept at high level (i.e., the logic level indicating faulty condition).

The isolating element 24 is, for example, a transformer (third isolating element ISO3) integrated on the transformer chip 130, and transmits the comparison pulse signal S23 from the secondary circuit system 100s to the primary circuit system 100p while isolating between the primary circuit system 100p and the secondary circuit system 100s.

As described above, the signal transmission device 100 inherently includes a first isolating element ISO1 and a second isolating element ISO2 used for signal transmission from the primary circuit system 100p to the secondary circuit system 100s. Accordingly, additionally integrating a third isolating element ISO3 for fault indication on the transformer chip 130 mentioned above makes it possible to transmit, within the signal transmission device 100, the result (i.e., the comparison pulse signal S23) of monitoring by the fault indication circuit 20 from the secondary circuit system 100s to the primary circuit system 100p.

The pulse receiver 25 (corresponding to an alarm signal generator) generates the alarm signal S3 according to the comparison pulse signal S23 fed to it via the isolating element 24, to output the alarm signal S3 from an ALARM pin to outside the device (e.g., to an ECU).

With the fault indication circuit 20 described above incorporated, as soon as the virtual output pulse signals S21 and S22 cease to coincide, that is, as soon as either of the first and second isolating elements ISO1 and ISO2 breaks down, it is possible to indicate without delay a fault in the signal transmission device 100 to outside the device. Thus, for example, an ECU that monitors the alarm signal S3 can recognize some fault in the signal transmission device 100 (a fault in either of the first and second isolating elements ISO1 and ISO2). It is thus possible to stop the vehicle safely or warn the driver.

While FIG. 6 deals with an example where a pulse in the alarm signal S3 is fed out via the ALARM pin, a fault may be indicated by any other means. For example, a register for storing the signal value of the alarm signal S3 may be provided in the fault indication circuit 20 and a fault may be indicated to outside the device by use of a CPU (central processing unit) interface such an I²C (inter-integrated circuit) or UART (universal asynchronous receiver/transmitter), or an interface complying with a standard for vehicle-onboard communication such as LIN (local interconnect network) or CAN (controller area network).

<Signal Transmission Operation and Fault Indication Operation (First Embodiment)>

Figure 7:
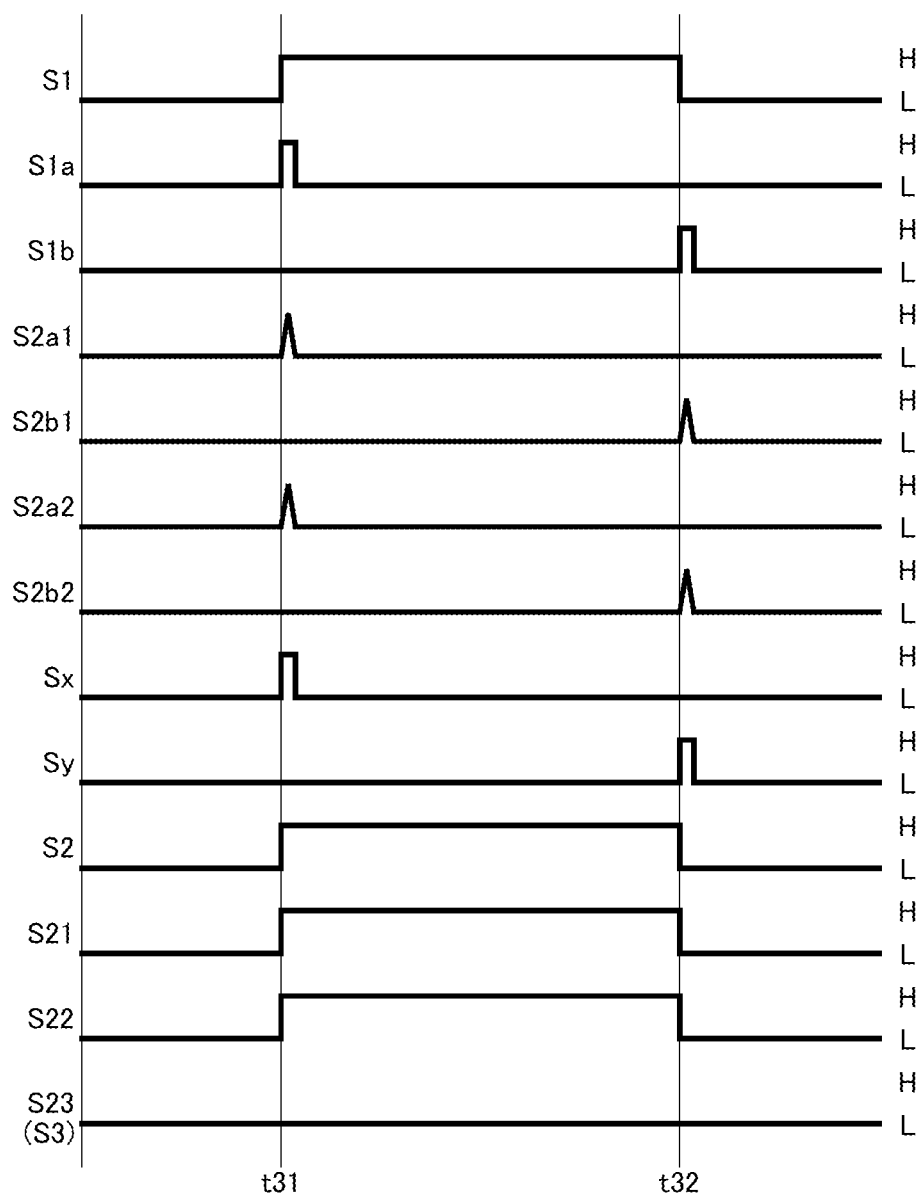
FIG. 7 is a diagram showing a first example (in normal condition) of isolated signal transmission operation and fault indication operation.

FIG. 7 is a diagram showing a first example (in normal condition) of isolated signal transmission operation and fault indication operation, depicting, from top down, the input pulse signal S1, the transmission pulse signals S1a and S1b, the reception pulse signals S2a1 and S2b1, the reception pulse signals S2a2 and S2b2, the OR signals Sx and Sy, the output pulse signal S2, the virtual output pulse signals S21 and S22, and the comparison pulse signal S23 (hence the alarm signal S3). In the diagram, for the sake of convenience, signal delays are omitted from depiction.

At a rising edge in the input pulse signal S1 at time point t31, the pulse transmitter 12 pulse-drives the transmission pulse signal S1a; at a falling edge in the input pulse signal S1 at time point t32, the pulse transmitter 12 pulse-drives the transmission pulse signal S1b.

Here, with neither of the first isolating element ISO1 and ISO2 at fault, at time point t31, an induced pulse appears in both the reception pulse signals S2a1 and S2a2, and thus the OR signal Sx rises to high level; at time point t32, an induced pulse appears in both the reception pulse signals S2b1 and S2b2, and thus the OR signal Sy rises to high level. As a result, when the input pulse signal S1 rises to high level, the output pulse signal S2 rises to high level accordingly; when the input pulse signal S1 falls the low level, the output pulse signal S2 falls to low level accordingly.

Moreover, with neither of the first isolating element ISO1 and ISO2 at fault, at time point t31, the induced pulse in each of the reception pulse signals S2a1 and S2a2 causes the virtual output pulse signals S21 and S22 both to rise to high level; at time point t32, the induced pulse in each of the reception pulse signals S2b1 and S2b2 causes the virtual output pulse signals S21 and S22 both to fall to low level. In this way, the logic levels of the virtual output pulse signals S21 and S22 coincide, and thus the comparison pulse signal S23 (hence the alarm signal S3) remains at low level.

Figure 8:
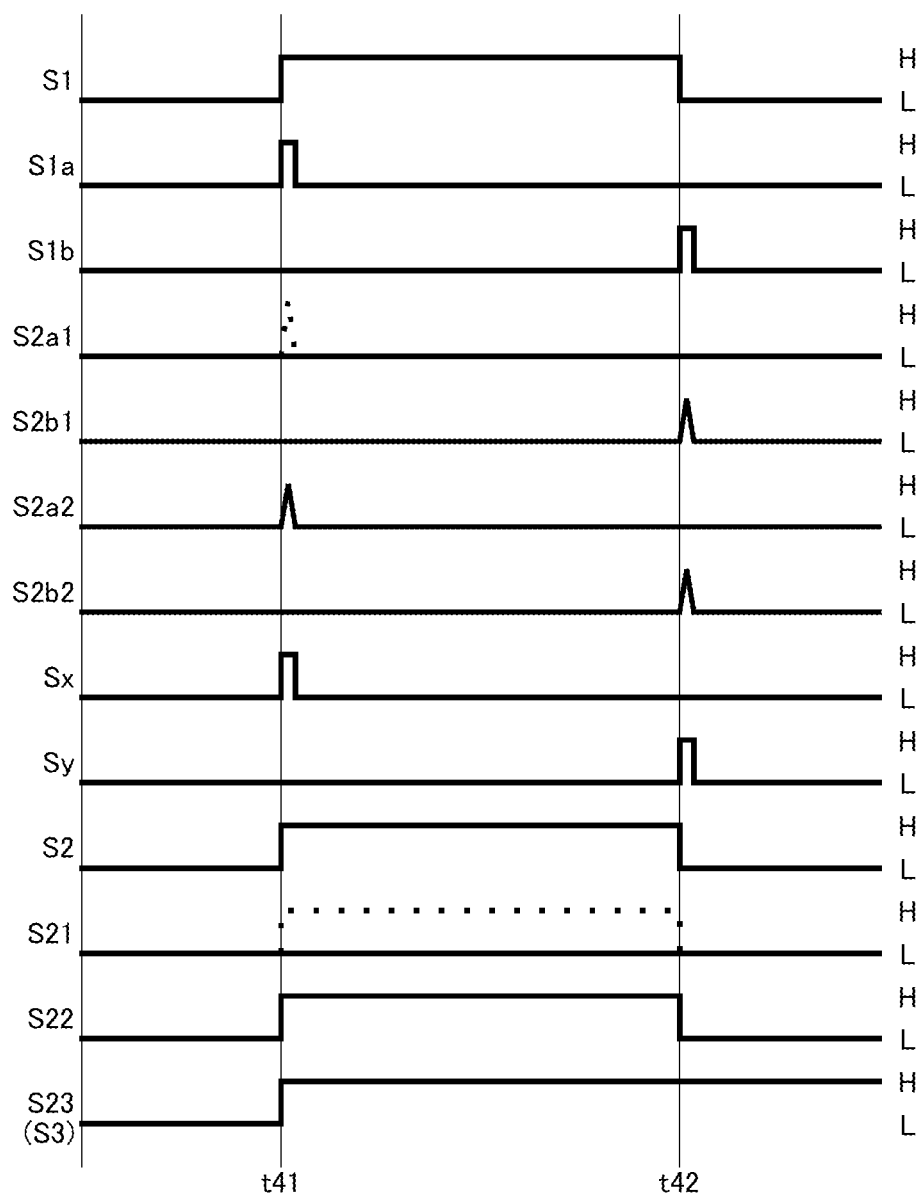
FIG. 8 is a diagram showing a second example (in set-fault condition) of isolated signal transmission operation and fault indication operation.

FIG. 8 is a diagram showing a second example (in set-fault condition) of isolated signal transmission operation and fault indication operation, depicting, like FIG. 7 referred to previously, from top down, the input pulse signal S1, the transmission pulse signals S1a and S1b, the reception pulse signals S2a1 and S2b1, the reception pulse signals S2a2 and S2b2, the OR signals Sx and Sy, the output pulse signal S2, the virtual output pulse signals S21 and S22, and the comparison pulse signal S23 (hence the alarm signal S3). In the diagram, for the sake of convenience, signal delays are omitted from depiction.

For example, if the transformer 15 is at fault, even when, at time point t41, the input pulse signal S1 rises to high level and the transmission pulse signal S1a is pulse-driven, no induced pulse appears in the reception pulse signal S2a1. Even so, if the transformer 17 is not at fault, an induced pulse appears in the reception pulse signal S2a2, and thus the OR signal Sx rises the high level. Hence, the output pulse signal S2 rises to high level without problem.

In contrast, the virtual output pulse signal S21 does not rise to high level unless an induced pulse appears in the reception pulse signal S2a1. As a result, the logic levels of the virtual output pulse signals S21 and S22 no longer coincide, and thus, at time point t41, the comparison pulse signal S23 (hence the alarm signal S3) rises to high level.

Figure 9:
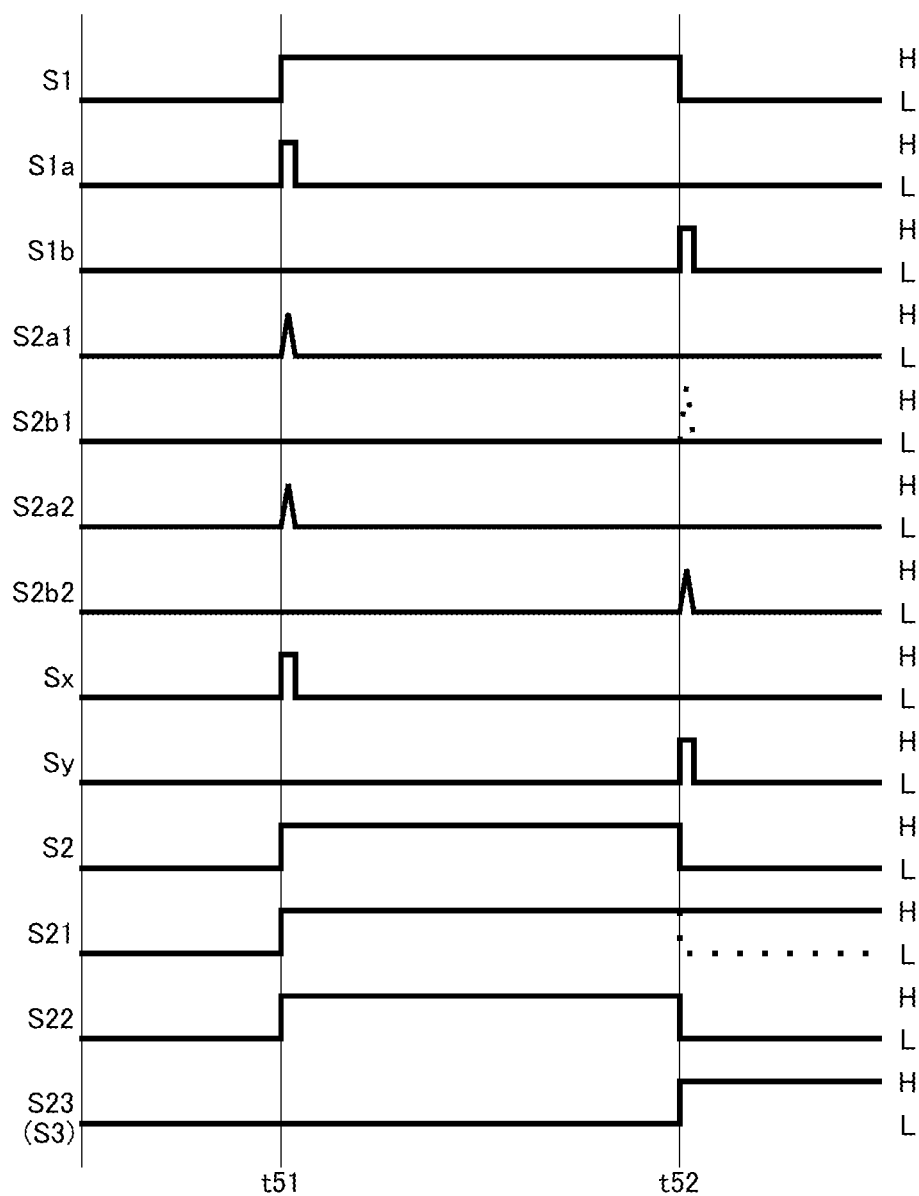
FIG. 9 is a diagram showing a third example (in reset-fault condition) of isolated signal transmission operation and fault indication operation.

FIG. 9 is a diagram showing a third example (in reset-fault condition) of isolated signal transmission operation and fault indication operation, depicting, like FIGS. 7 and 8 referred to previously, from top down, the input pulse signal S1, the transmission pulse signals S1a and S1b, the reception pulse signals S2a1 and S2b1, the reception pulse signals S2a2 and S2b2, the OR signals Sx and Sy, the output pulse signal S2, the virtual output pulse signals S21 and S22, and the comparison pulse signal S23 (hence the alarm signal S3). In the diagram, for the sake of convenience, signal delays are omitted from depiction.

For example, if the transformer 16 is at fault, even when, at time point t52, the input pulse signal S1 falls to low level and the transmission pulse signal S1b is pulse-driven, no induced pulse appears in the reception pulse signal S2b1. Even so, if the transformer 18 is not at fault, an induced pulse appears in the reception pulse signal S2b2, and thus the OR signal Sy rises to high level. Hence, the output pulse signal S2 falls to low level without problem.

In contrast, the virtual output pulse signal S21 does not fall to low level unless an induced pulse appears in the reception pulse signal S2b1. As a result, the logic levels of the RS flip-flops 21 and 22 no longer coincide, and thus, at time point t52, the comparison pulse signal S23 (hence the alarm signal S3) rises to high level.

<Signal Transmission Device (Second Embodiment)>

Figure 10:
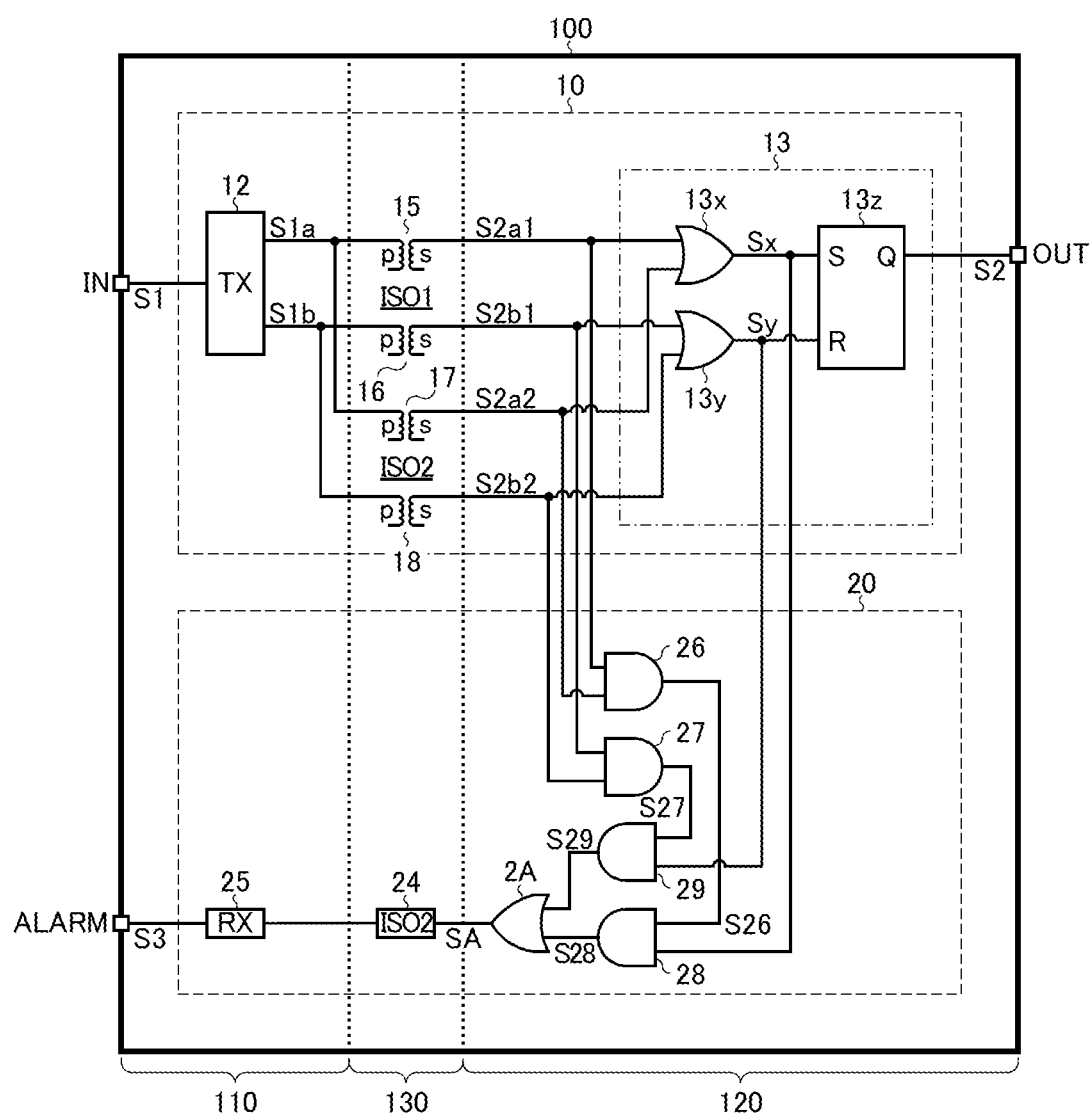
FIG. 10 is a diagram showing a signal transmission device according to a second embodiment.

FIG. 10 is a diagram showing a signal transmission device 100 according to a second embodiment. While the signal transmission device 100 of this embodiment is based on the first embodiment (FIG. 6), the fault indication circuit 20 here has a modified internal configuration. In terms of what is shown in the diagram, the fault indication circuit 20 includes, instead of the RS flip-flops 21 and 22 and the signal comparator 23 mentioned previously, AND gates 26 to 29 and an OR gate 2A.

The AND gate 26 generates the AND signal S26 of the reception pulse signals S2a1 and S2a2. The AND signal S26 is at low level when at least either of the reception pulse signals S2a1 and S2a2 is at low level, and is high level when the reception pulse signals S2a1 and S2a2 are both at high level.

The AND gate 27 generates the AND signal S27 of the reception pulse signals S2b1 and S2b2. The AND signal S27 is at low level when at least either of the reception pulse signals S2b1 and S2b2 is at low level, and is high level when the reception pulse signals S2b1 and S2b2 are both at high level.

A waveform shaper such as a Schmitt buffer may be provided in the stage preceding each of the AND gates 26 and 27.

The AND gate 28 generates the AND signal S28 of the OR signal Sx and the AND signal S26. The AND signal S28 is at low level when at least either of the OR signal Sx and the AND signal S26 is at low level, and is at high level when the OR signal Sx and the AND signal S26 are both at high level.

The AND gate 29 generates the AND signal S29 of the OR signal Sy and the AND signal S27. The AND signal S29 is at low level when at least either of the OR signal Sy and the AND signal S27 is at low level, and is at high level when the OR signal Sy and the AND signal S27 are both at high level.

The OR gate 2A generates the OR signal SA of the AND signals S28 and S29. The OR signal SA is at high level when at least either of the AND signals S28 and S29 is at high level, and is at low level when the AND signals S28 and S29 are both at low level.

The isolating element 24 is a transformer (third isolating element ISO3) integrated on the transformer chip 130, and transmits the OR signal SA from the secondary circuit system 100s to the primary circuit system 100p while isolating between the primary circuit system 100p and the secondary circuit system 100s.

The pulse receiver 25 generates the alarm signal S3 according to the OR signal SA fed to it via the isolating element 24, and outputs the alarm signal S3 from the ALARM pin to outside the device (to an ECU or the like). If the first and second isolating elements ISO1 and ISO2 are both normal, every time the logic level of the input pulse signal S1 switches, a pulse appears in the alarm signal S3. By contrast, if either of the first and second isolating elements ISO1 and ISO2 is at fault, pulses fail to appear in the alarm signal S3.

With the fault indication circuit 20 described above incorporated, as soon as either of the first and second isolating elements ISO1 and ISO2 breaks down, it is possible to indicate without delay a fault in the signal transmission device 100 to outside the device. Thus, for example, an ECU that monitors the alarm signal S3 can recognize some fault in the signal transmission device 100 (a fault in either of the first and second isolating elements ISO1 and ISO2). It is thus possible to stop the vehicle safely or warn the driver.

<Signal Transmission Device (Third Embodiment)>

Figure 11:
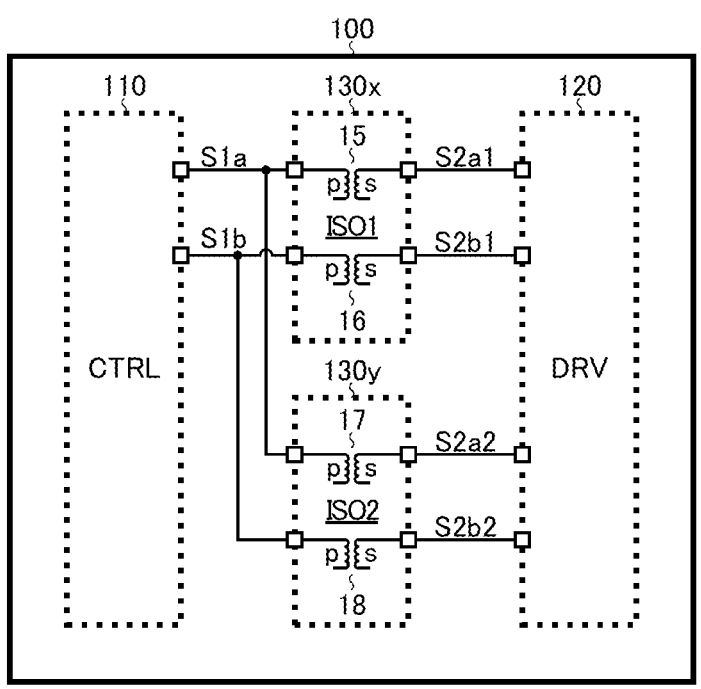
FIG. 11 is a diagram showing a signal transmission device according to a third embodiment.

FIG. 11 is a diagram showing a signal transmission device 100 according to a third embodiment. While the signal transmission device 100 of this embodiment is based on the first embodiment (FIG. 6) or the second embodiment (FIG. 10) described previously, here, instead of the single transformer chip 130, a plurality of transformer chips 130x and 130y are sealed in the package.

Incidentally, on the transformer chip 130x, the first isolating element ISO1 (transformers 15 and 16) can be integrated. On the other hand, on the transformer chip 130y, the second isolating element ISO2 (transformers 17 and 18) can be integrated.

Integrating the first and second isolating elements ISO1 and ISO2 in a manner distributed among a plurality of transformer chips 130x and 130y respectively in this way helps enhance the safety of the signal transmission device 100.

It is possible to implement a fail-safe function easily without re-designing existing transformer chips by using, as the transformer chips 130x and 130y, chips with an identical structure (the same products).

<Signal Transmission Device (Fourth Embodiment)>

Figure 12:
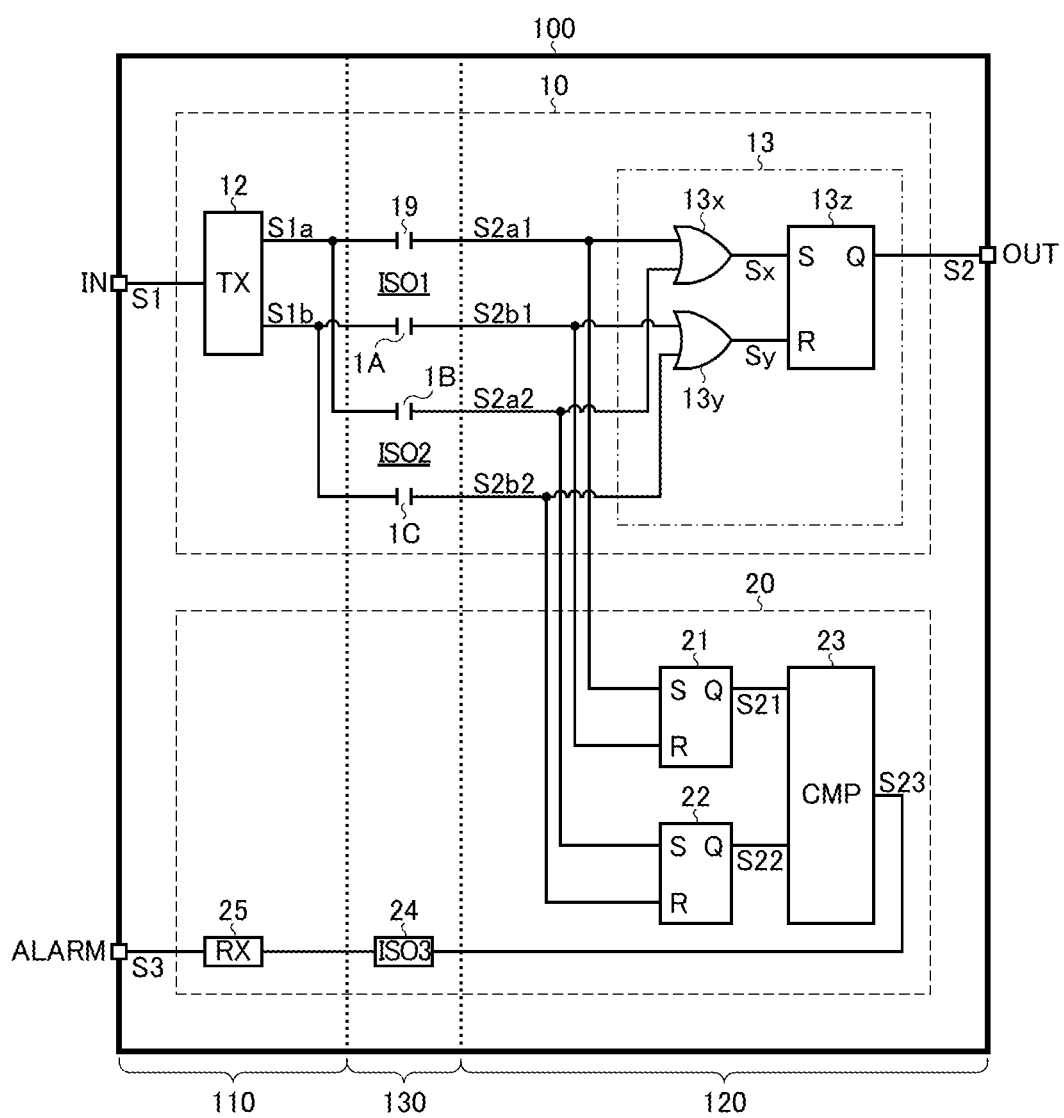
FIG. 12 is a diagram showing a signal transmission device according to a fourth embodiment.

FIG. 12 is a diagram showing a signal transmission device 100 according to a fourth embodiment. While the signal transmission device 100 of this embodiment is based on the first embodiment (FIG. 6) described previously, the transformers 15 to 18 there are here replaced with capacitors 19 to 1C respectively.

The first terminal of the capacitor 19 is connected to the first output terminal of the pulse transmitter 12 (i.e., an output terminal for the transmission pulse signal S1a). The second terminal of the capacitor 19 is connected to the first input terminal of the OR gate 13x (i.e., an input terminal for the reception pulse signal S2a1).

The first terminal of the capacitor 1A is connected to the second output terminal of the pulse transmitter 12 (i.e., an output terminal for the transmission pulse signal S1b). The second terminal of the capacitor 1A is connected to the first input terminal of the OR gate 13y (i.e., an input terminal for the reception pulse signal S2b1).

The first terminal of the capacitor 1B is connected to the first output terminal of the pulse transmitter 12 (i.e., an output terminal for the transmission pulse signal S1a). The second terminal of the capacitor 1B is connected to the second input terminal of the OR gate 13x (i.e., an input terminal for the reception pulse signal S2a2).

The first terminal of the capacitor 1C is connected to the second output terminal of the pulse transmitter 12 (i.e., an output terminal for the transmission pulse signal S1b). The second terminal of the capacitor 1C is connected to the second input terminal of the OR gate 13y (i.e., an input terminal for the reception pulse signal S2b2).

As described above, the first and second isolating elements ISO1 and ISO2 need not necessarily be transformers but may instead be capacitors. Though not illustrated specifically, the first and second isolating elements ISO1 and ISO2 may be photocouplers.

<Signal Transmission Device (Fifth Embodiment)>

Figure 13:
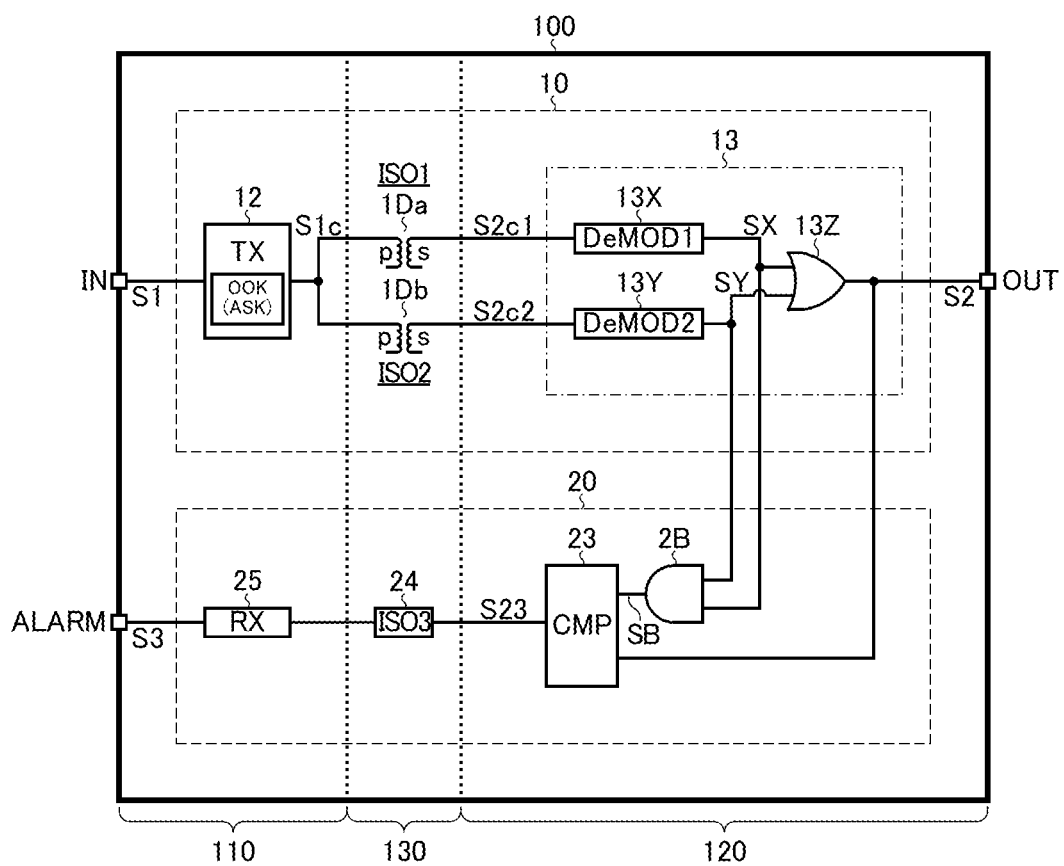
FIG. 13 is a diagram showing a signal transmission device according to a fifth embodiment.

FIG. 13 is a diagram showing a signal transmission device 100 according to a fifth embodiment. While the signal transmission device 100 of this embodiment is based on the first embodiment (FIG. 6), the pulse transmitter 12 here incorporates a signal modulation function and the circuits in the succeeding stages are modified accordingly.

First, a detailed description will be given of the isolated signal transmission circuit 10 provided with a fail-safe function. In the isolated signal transmission circuit 10 of this embodiment, the pulse transmitter 12 includes a modulator that performs OOK (on-off keying) modulation (a kind of ASK [amplitude-shift keying] modulation), and generates a transmission pulse signal S1c that has on-off modulation (a kind of amplitude-shift modulation whereby the amplitude of the transmission pulse signal S1c is varied) applied to it according to the input pulse signal S1.

A transformer 1Da outputs, according to the transmission pulse signal S1c fed to the primary winding 1Dap, a reception pulse signal S2c1 from the secondary winding 1Das.

A transformer 1Db outputs, according to the transmission pulse signal S1c fed to the primary winding 1Dbp, a reception pulse signal S2c2 from the secondary winding 1Dbs.

The pulse receiver 13 includes demodulators 13X and 13Y and an OR gate 13Z.

The demodulator 13X applies predetermined modulation to the reception pulse signal S2c1, and thereby generates a demodulated pulse signal SX.

The demodulator 13Y applies predetermined modulation to the reception pulse signal S2c2, and thereby generates a demodulated pulse signal SY.

The OR gate 13Z performs an OR operation between the demodulated pulse signals SX and SY, and thereby generates the output pulse signal S2. Accordingly, the output pulse signal S2 is at high level when at least either of the demodulated pulse signals SX and SY is at high level, and is at low level when the demodulated pulse signals SX and SY are both at low level.

As described above, the signal transmission device 100 (in particular, the isolated signal transmission circuit 10) according to this embodiment includes: a pulse transmitter 12 provided in a primary circuit system 100p and configured to generate a transmission pulse signal S1c according to an input pulse signal S1; a first isolating element ISO1 (transformer 1Da) configured to constitute a first signal transmission path for transmission of the transmission pulse signal S1c from the primary circuit system 100p to a secondary circuit system 100s; a second isolating element ISO2 (transformer 1Db) configured to constitute a second signal transmission path, different from the first transmission pass mentioned above, for transmission of the transmission pulse signal S1c from the primary circuit system 100p to the secondary circuit system 100s; and a pulse receiver 13 provided in the secondary circuit system 100s and configured to generate a single output pulse signal S2 by feeding reception pulse signals S2c1 and S2c2 output respectively from the first and second isolating elements ISO1 and ISO2 to a logic circuit (OR gate 13Z).

Thus, even if either of the first and second isolating elements ISO1 and ISO2 is at fault, so long as the other is operating normally, the input pulse signal S1 to the primary circuit system 100p can be transmitted as the output pulse signal S2 from the secondary circuit system 100s, with no adverse effect on the driving of a load provided in the secondary circuit system 100s.

Next, the fault indication circuit 20 will be described. The fault indication circuit 20 includes, instead of the RS flip-flops 21 and 22 mentioned previously, an AND gate 2B.

The AND gate 2B generates the AND signal SB of the demodulated pulse signals SX and SY. The AND signal SB is at low level when at least either of the demodulated pulse signals SX and SY is at low level, and is at high level when the demodulated pulse signals SX and SY are both at high level.

The signal comparator 23 compares the output pulse signal S2 and the AND signal SB, and thereby outputs a comparison pulse signal S23 that indicates whether the two signals coincide or not. For example, when the output pulse signal S2 and the AND signal SB coincide, the comparison pulse signal S23 is at low level (the logic level indicating normal condition); when the output pulse signal S2 and the AND signal SB do not coincide, the comparison pulse signal S23 is at high level (the logic level indicating faulty condition).

The isolating element 24 transmits the comparison pulse signal S23 from the secondary circuit system 100s to the primary circuit system 100p while isolating between the primary circuit system 100p and the secondary circuit system 100s.

The pulse receiver 25 generates an alarm signal S3 according to the comparison pulse signal S23 fed to it via the isolating element 24, and outputs the alarm signal S3 from the ALARM pin to outside the device (to an ECU or the like).

With the fault indication circuit 20 described above incorporated, as soon as the output pulse signal S2 and the AND signal SB cease to coincide, that is, as soon as either of the first and second isolating elements ISO1 and ISO2 is breaks down, it is possible to indicate without delay a fault in the signal transmission device 100 to outside the device. Thus, for example, an ECU that monitors the alarm signal S3 can recognize some fault in the signal transmission device 100 (a fault in either of the first and second isolating elements ISO1 and ISO2). It is thus possible to stop the vehicle safely or warn the driver.

<Signal Transmission Operation (Fifth Embodiment)>

Figure 14:
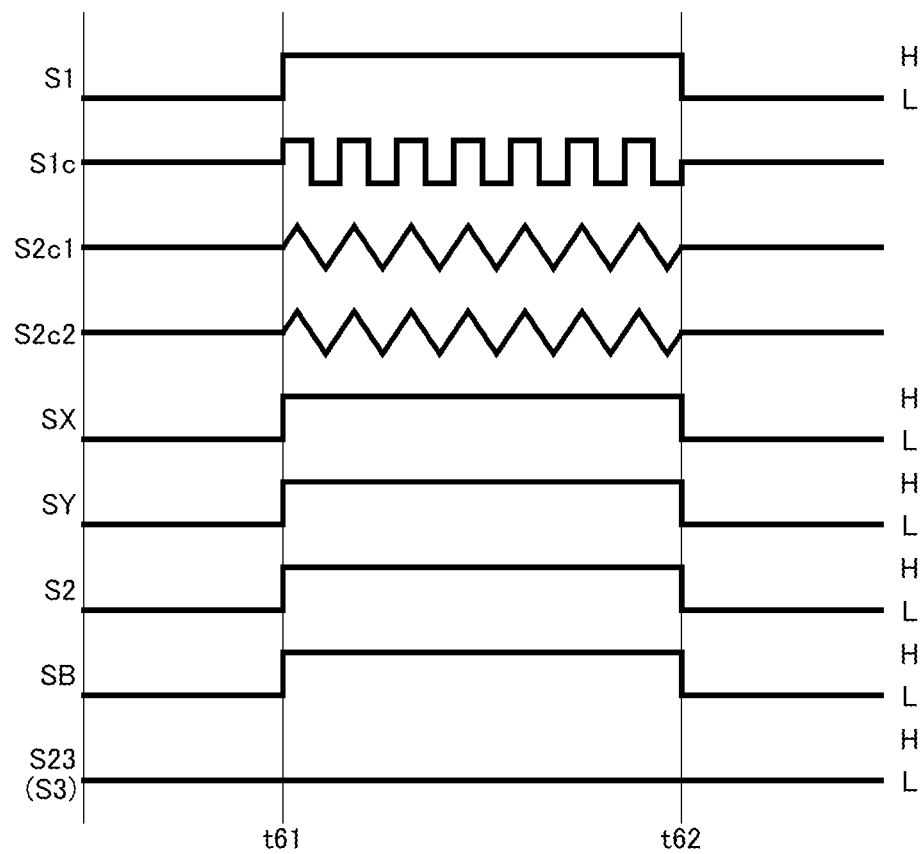
FIG. 14 is a diagram showing a fourth example (in normal condition) of isolated signal transmission operation and fault indication operation.

FIG. 14 is a diagram showing a fourth example (in normal condition) of isolated signal transmission operation and fault indication operation, depicting, from top down, the input pulse signal S1, the transmission pulse signal S1c, the reception pulse signals S2c1 and S2c1, the demodulated pulse signals SX and SY, the output pulse signal S2, the AND signal SB, and the comparison pulse signal S23 (hence the alarm signal S3). In the diagram, for the sake of convenience, signal delays are omitted from depiction.

The pulse transmitter 12 applies on-off modulation to the transmission pulse signal S1c during the high-level period of the input pulse signal S1 (i.e., between time points t61 and t62).

Here, with neither of the first and second isolating elements ISO1 and ISO2 at fault, during the high-level period of the input pulse signal S1 (i.e., between time points t61 and t62), an induced pulse appears in both the reception pulse signals S2c1 and S2c2, and thus the demodulated pulse signals SX and SY both rise to high level. As a result, when the input pulse signal S1 rises to high level, the output pulse signal S2 rises to high level accordingly; when the input pulse signal S1 falls to low level, the output pulse signal S2 falls to low level accordingly.

Moreover, with neither of the first and second isolating elements ISO1 and ISO2 at fault, during the high-level period of the input pulse signal S1 (i.e., between time points t61 and t62), the AND signal SB rises to high level. In this way, the logic levels of the output pulse signal S2 and the AND signal SB coincide, and thus the comparison pulse signal S23 (hence the alarm signal S3) remains at low level.

Figure 15:
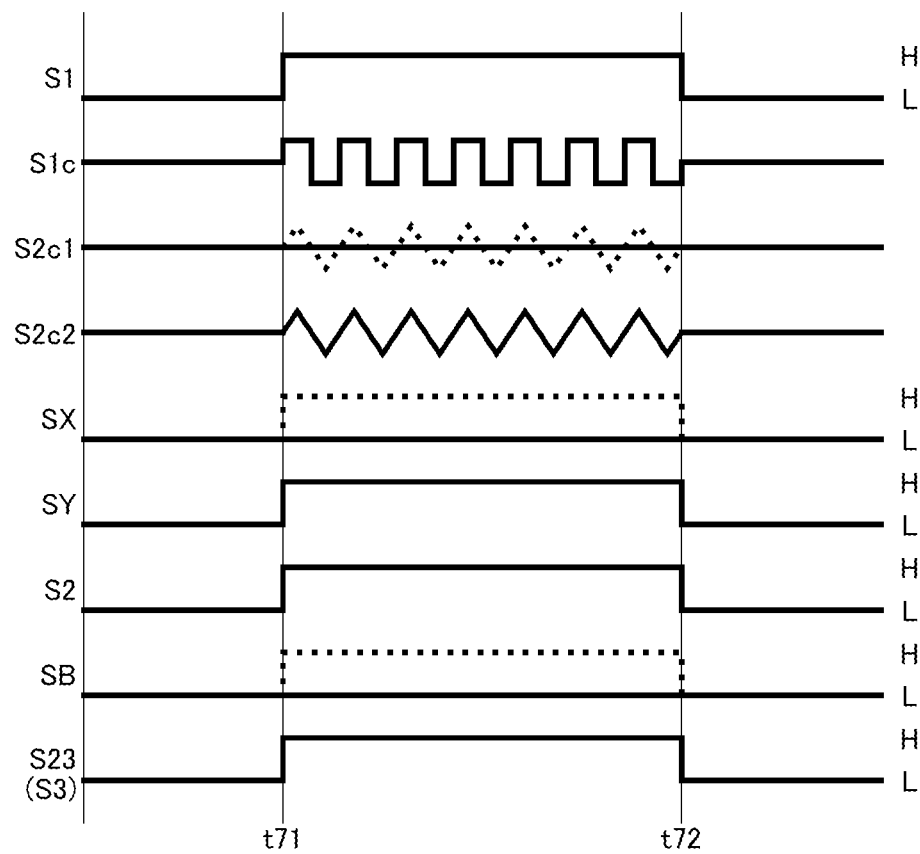
FIG. 15 is a diagram showing a fifth example (in fault condition) of isolated signal transmission operation and fault indication operation.

FIG. 15 is a diagram showing a fifth example (in faulty condition) of isolated signal transmission operation and fault indication operation, depicting, like FIG. 14 referred to previously, from top down, the input pulse signal S1, the transmission pulse signal S1c, the reception pulse signals S2c1 and S2c1, the demodulated pulse signals SX and SY, the output pulse signal S2, the AND signal SB, and the comparison pulse signal S23 (hence the alarm signal S3). In the diagram, for the sake of convenience, signal delays are omitted from depiction.

For example, if the first isolating element ISO1 is at fault, during the high-level period of the input pulse signal S1 (i.e., between time points t61 and t62), no induced pulse appears in the reception pulse signal S2c1, and thus the demodulated pulse signal SX remains at low level. Even so, if the second isolating element ISO2 is not at fault, an induced pulse appears in the reception pulse signal S2c2, and thus the demodulated pulse signal SY rises to high level. Hence, the output pulse signal S2 rises to high level without problem.

In contrast, with the demodulated pulse signal SX remaining at low level, the AND signal SB does not rise to high level. As a result, the logic levels of the output pulse signal S2 and the AND signal SB cease to coincide, and thus, between time points t71 and t72, the comparison pulse signal S23 (hence the alarm signal S3) rises to high level.

Though not illustrated specifically, also when the second isolating element ISO2 is at fault, the output pulse signal S2 rises to high level without problem.

<Signal Transmission Device (Sixth Embodiment)>

Figure 16:
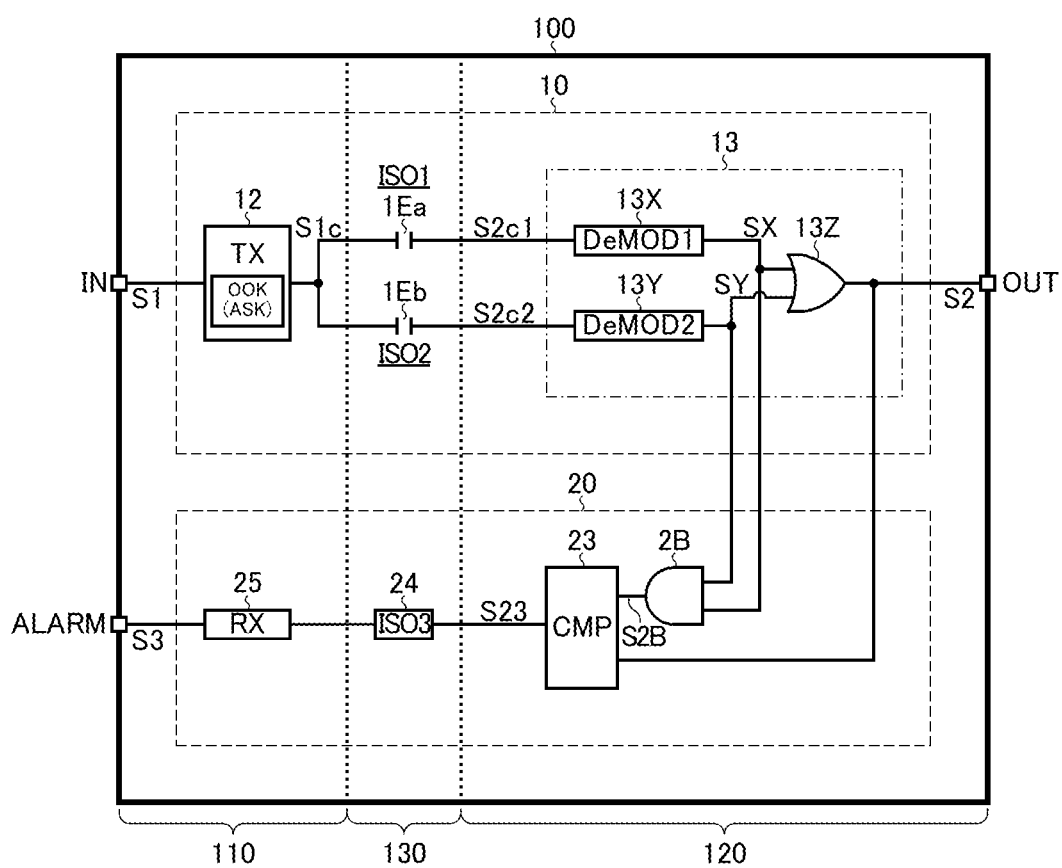
FIG. 16 is a diagram showing a signal transmission device according to a sixth embodiment.

FIG. 16 is a diagram showing a signal transmission device 100 according to a sixth embodiment. While the signal transmission device 100 of this embodiment is based on the fifth embodiment (FIG. 13) described previously, the transformers 1Da and 1Db there is here replaced with capacitors 1Ea and 1Eb respectively.

The first terminal of the capacitor 1Ea is connected to the output terminal of the pulse transmitter 12 (i.e., an output terminal for the transmission pulse signal S1c). The second terminal of the capacitor 1Ea is connected to the input terminal of the demodulator 13X (i.e., an input terminal for the reception pulse signal S2c1).

The first terminal of the capacitor 1Eb is connected to the output terminal of the pulse transmitter 12 (i.e., an output terminal for the transmission pulse signal S1c). The second terminal of the capacitor 1Eb is connected to the input terminal of the demodulator 13Y (i.e., an input terminal for the reception pulse signal S2c2).

As described above, the first and second isolating elements ISO1 and ISO2 need not necessarily be transformers but may instead be capacitors. Though not illustrated specifically, the first and second isolating elements ISO1 and ISO2 may be photocouplers.

<Electronic Device>

Figure 17:
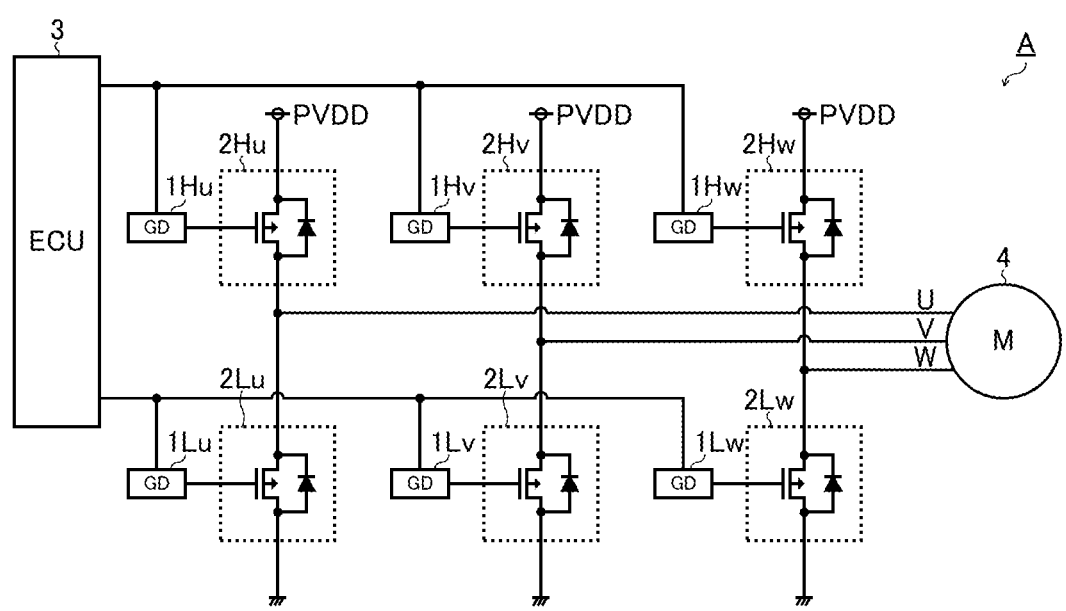
FIG. 17 is a diagram showing one configuration example of an electronic device that incorporates a signal transmission device.

FIG. 17 is a diagram showing one configuration example of an electronic device that incorporates a signal transmission device 100. The electronic device A of this configuration example includes high-side gate drivers IC1H (u/v/w), low-side gate drivers ICIL (u/v/w), high-side transistors 2H (u/v/w), low-side transistors 2L (u/v/w), an ECU 3, and a motor 4.

The high-side gate drivers IC1H (u/v/w), while isolating between the ECU 3 and the high-side transistors 2H (u/v/w), generate high-side gate drive signals (corresponding to the output pulse signal S2) according to the high-side gate signals (corresponding to the input pulse signal S1) fed from the ECU 3, and thereby drive the high-side transistors 2H (u/v/w).

The low-side gate drivers ICIL (u/v/w), while isolating between the ECU 3 and the low-side transistors 2L (u/v/w), generate low-side gate drive signals (corresponding to the output pulse signal S2) according to the low-side gate signals (corresponding to the input pulse signal S1) fed from the ECU 3, and thereby drive the low-side transistors 2L (u/v/w).

As each of the high-side and low-side gate drivers IC1H (u/v/w) and ICIL (u/v/w) in FIG. 17, a signal transmission device 100 according to any of the first to sixth embodiments described above can be used.

The high-side transistors 2H (u/v/w) are each connected, as a high-side switch in a half-bridge output stage for one of three phases (U/V/W phases), between a power-system power terminal (i.e., an application terminal for a motor driving voltage PVDD) and the input terminal of the motor 4 for the corresponding phase.

The low-side transistors 2L (u/v/w) are each connected, as a low-side switch in a half-bridge output stage for one of three phases (U phase/V phase/W phase), between the input terminal of the motor 4 for the corresponding phase and a power-system ground terminal.

In FIG. 17, the high-side and low-side transistors 2H (u/v/w) and 2L (u/v/w) are each implemented as an N-channel MOSET (metal-oxide-semiconductor field-effect transistor). Instead, for example, the high-side transistors 2H (u/v/w) may be implemented as P-channel MOSETs. Instead of MOSFETs, IGBTs (insulated-gate bipolar transistor) may be used. Or, the high-side and low-side transistors 2H (u/v/w) and 2L (u/v/w) may be implemented as, instead of common Si device, devices using a wide-bandgap semiconductor (such as SiC devices or GaN devices).

The ECU 3 drives the high-side and low-side transistors 2H (u/v/w) and 2L (u/v/w) via the high-side and low-side gate drivers IC1H (u/v/w) and ICIL (u/v/w) respectively, and thereby controls the driving of the rotation of the motor 4. The ECU 3 also has a function of performing various kinds of safety control based on the alarm signal S3 fed from the fault indication circuit 20 (unillustrated) in each of the high-side and low-side gate drivers IC1H (u/v/w) and ICIL (u/v/w).

The motor 4 is a three-phase motor that is driven to rotate according to three-phase driving voltages U/V/W fed from the half-bridge output stages for three phases (U/V/W phases) respectively.

Figure 18:
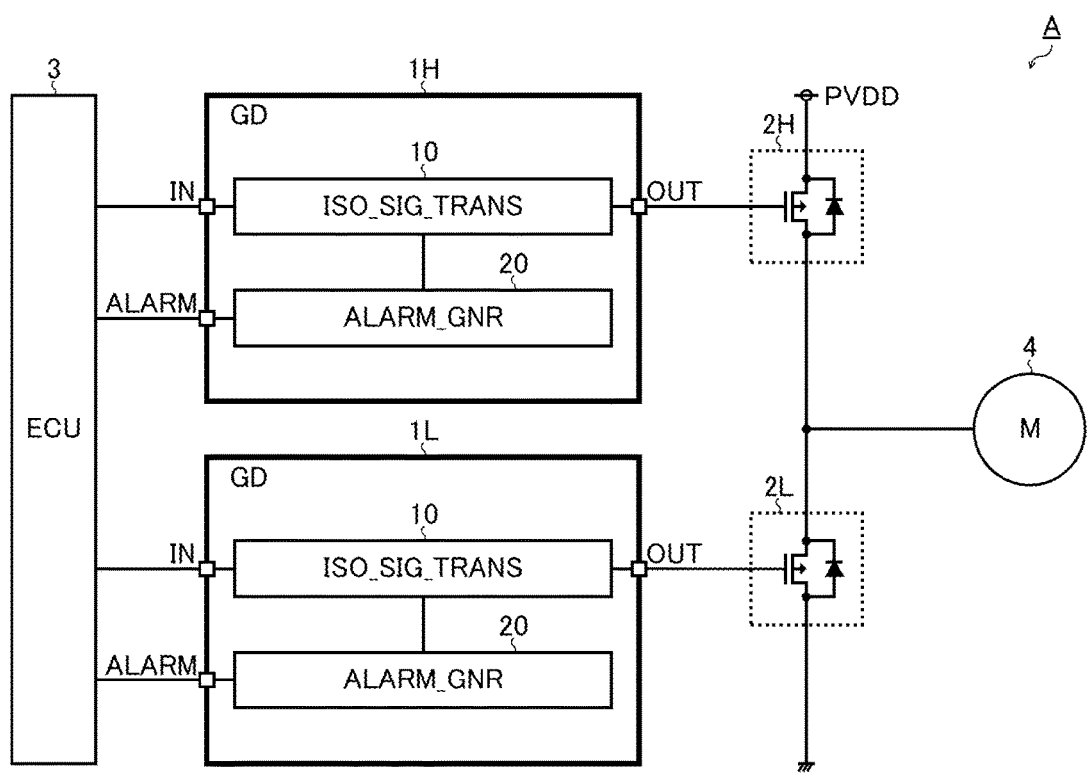
FIG. 18 is a diagram showing, in an extracted form, the part of an electronic device corresponding to one phase.

FIG. 18 is a diagram showing, in an extracted form, the part of the electronic device A corresponding to one phase. As shown there, the IN pin and the ALARM pin of each of the high-side and low-side gate driver ICs 1H and IL are connected to the ECU 3. On the other hand, the OUT pin of each of the high-side and low-side gate driver ICs 1H and 1L is connected to the gates of the corresponding high-side and low-side power transistors 2H and 2L.

With this configuration, the ECU 3 can recognize a fault, if any, in signal transmission based on the alarm signal S3 fed from each of the high-side and low-side gate driver ICs 1H and 1L, and can perform appropriate control for safety.

<Application to Vehicles>

Figure 19:
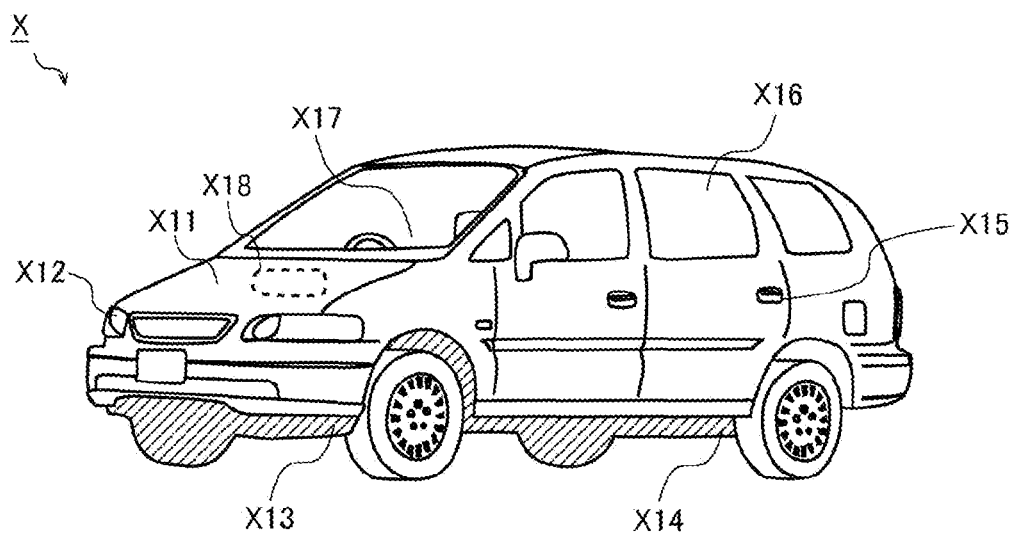
FIG. 19 is a diagram showing the exterior appearance of a vehicle that incorporates an electronic device.

FIG. 19 is a diagram showing the exterior appearance of a vehicle that incorporates an electronic device. The vehicle X of this configuration example incorporates a battery (unillustrated in the diagram) and various electronic devices X11 to X18 that operate by being supplied with electric power from the battery.

The vehicle X can be an engine vehicle or an electric vehicle (an xEV such as a BEV [battery electric vehicle], HEV [hybrid electric vehicle], PHEV/PHV [plug-in hybrid electric vehicle/plug-in hybrid vehicle], or FCEV/FCV (fuel cell electric vehicle/fuel cell vehicle]).

For the sake of convenience, in FIG. 19, the electronic devices X11 to X18 may be shown at places different from where they are actually arranged.

The electronic device X11 is an electronic control unit that performs control with respect to an engine (injection control, electronic throttle control, idling control, oxygen sensor heater control, automatic cruise control, etc.), or an electronic control unit that performs control with respect to a motor (torque control, electric power regeneration control, etc.).

The electronic device X12 is a lamp control unit that controls the lighting and extinguishing of HIDs (high-intensity discharged lamps), DRLs (daytime running lamps), and the like.

The electronic device X13 is a transmission control unit that performs control with respect to a transmission.

The electronic device X14 is a movement control unit that performs control with respect to the movement of the vehicle X (ABS [anti-lock brake system] control, EPS [electric power steering] control, electronic suspension control, and the like).

The electronic device X15 is a security control unit that drives and controls door locks, burglar alarms, and the like.

The electronic device X16 comprises electronic devices incorporated in the vehicle X as standard or manufacturer-fitted equipment at the stage of factory shipment, such as wipers, power side mirrors, power windows, dampers (shock absorbers), a power sun roof, and power seats.

The electronic device X17 comprises electronic devices fitted to the vehicle X optionally as user-fitted equipment, such as A/V (audio/visual) equipment, a car navigation system, and an ETC (electronic toll control system).

The electronic device X18 comprises electronic devices provided with high-withstand-voltage motors, such as a vehicle-mounted blower, an oil pump, a water pump, and a battery cooling fan.

The electronic devices X11 to X18 can be understood as specific examples of the electronic device A described previously. That is, any of the signal transmission devices 100 described previously can be built into any of the electronic devices X11 to X18.

<Overview>

To follow is an overview of the various embodiments described above.

According to one aspect of what is disclosed herein, for example, a signal transmission device includes: a transmitter provided in a primary circuit system and configured to generate a transmission signal according to an input signal; at least one first isolating element configured to constitute a first signal transmission path for transmission of the transmission signal from the primary circuit system to the secondary circuit system; at least one second isolating element configured to constitute a second signal transmission path, different from the first signal transmission path, for transmission of the transmission signal from the primary circuit system to the secondary circuit system; and a receiver provided in the secondary circuit system and configured to feed a first reception signal and a second reception signal output respectively from the first and second isolating elements to a logic circuit to generate a single output signal. (A first configuration.)

In the signal transmission device according to the first configuration described above, the logic circuit may include at least one of: a combinational circuit configured to determine its output based on the current input to it; and a sequential circuit configured to determine its output based on the current and past inputs to it. (A second configuration.)

In the signal transmission device according to the first or second configuration described above, there may be further provided a fault indication circuit configured to generate an alarm signal indicating a fault in either of the first and second isolating elements by monitoring both the first and second reception signals. (A third configuration.)

In the signal transmission device according to the third configuration described above, the fault indication circuit may include: a first sequential circuit provided in the secondary circuit system and configured to generate a first virtual output signal from the first reception signal; a second sequential circuit provided in the secondary circuit system and configured to generate a second virtual output signal from the second reception signal; a signal comparator provided in the secondary circuit system and configured to compare the first and second virtual output signals to thereby generate a comparison signal; a third isolating element configured to transmit the comparison signal from the secondary circuit system to the primary circuit system; and an alarm signal generator provided in the primary circuit system and configured to generate the alarm signal according to the comparison signal fed thereto via the third isolating element. (A fourth configuration.)

In the signal transmission device according to any of the first to fifth configuration described above, the transmitter may be configured to vary the amplitude of the transmission signal according to the input signal. (A fifth configuration.)

In the signal transmission device according to the fifth configuration described above, the transmitter may include a modulator configured to perform ASK (amplitude-shift keying) modulation. (A sixth configuration.)

In the signal transmission device according to the fifth configuration described above, the transmitter may include a modulator configured to perform OOK (on-off keying) modulation. (A seventh configuration.)

In the signal transmission device according to any of the first to seventh configuration described above, a first chip on which circuit elements of the primary circuit system are integrated, a second chip on which circuit elements of the secondary circuit system are integrated, and at least one third chip on which the first and second isolating elements are integrated may be sealed in a single package. (An eighth configuration.)

In the signal transmission device according to the eighth configuration described above, the first and second isolating elements may both be integrated in a consolidated manner on a single chip as the third chip. (A ninth configuration.)

In the signal transmission device according to the eighth configuration described above, the first and second isolating elements may be integrated in a distributed manner on a plurality of chips as the third chips respectively. (A tenth configuration.)

In the signal transmission device according to the tenth configuration described above, plurality of third chips may all have an identical structure. (An eleventh configuration.)

In the signal transmission device according to any of the first to eleventh configuration described above, the first and second isolating elements may all be transformers, capacitors, or photocouplers. (A twelfth configuration.)

According to another aspect of what is disclosed herein, an electronic device includes: a power transistor; and a gate driver IC configured to drive the gate of the power transistor. The gate driver IC may be the signal transmission device according to any of the first to twelfth configurations described above. (A thirteenth configuration.)

According to yet another aspect of what is disclosed herein, a vehicle includes the electronic device according to the thirteenth configuration described above. (A fourteenth configuration.)

<Other Modifications>

The various technical features disclosed herein may be implemented in any manners other than as in the embodiments described above, and allow for many modifications without departure from the spirit of their technical ingenuity. That is, the embodiments described above should be understood to be in every aspect illustrative and not restrictive, and the technical scope of the present invention is defined not by the description of the embodiments given above but by the appended claims and encompasses any modifications within a scope and sense equivalent to those claims.

REFERENCE SIGNS LIST 1H (u/v/w) high-side gate driver IC
1L (u/v/w) low-side gate driver IC
2H (u/v/w) high-side power transistor
2L (u/v/w) low-side power transistor
3 ECU
4 motor
10 isolated signal transmission circuit
11 Schmitt buffer
12 pulse transmitter
13 pulse receiver
13x, 13y OR gate
13z RS flip-flop
13X, 13Y demodulator
13Z OR gate
14 driver
15, 16, 17, 18, 1Da, 1Db transformer
15p, 16p, 17p, 18p, 1Dap, 1Dbp primary winding
15s, 16s, 17s, 18s, 1Das, 1Dbs secondary winding
19, 1A, 1B, 1C, 1Ea, 1Eb capacitor
20 fault indication circuit
21, 22 RS flip-flop
23 signal comparator
24 isolating element
25 pulse receiver
26, 27, 28, 29, 2B AND gate
2A OR gate
100 signal transmission device (isolated gate driver IC)
100p primary circuit system
100s secondary circuit system
110 controller chip
120 driver chip
130, 130x, 130y transformer chip
A electronic device
ISO1 first isolating element
ISO2 second isolating element
ISO3 third isolating element
X vehicle
X11-X18 electronic device

The invention claimed is:

1. A signal transmission device comprising:
a transmitter provided in a primary circuit system and configured to generate a first transmission signal and a second transmission signal according to an input signal;
at least one first isolating element configured to constitute a first signal transmission path for transmission of the first transmission signal and the second transmission signal from the primary circuit system to a secondary circuit system;
at least one second isolating element configured to constitute a second signal transmission path, different from the first signal transmission path, for transmission of the first transmission signal and the second transmission signal from the primary circuit system to the secondary circuit system; and
a receiver provided in the secondary circuit system and configured to feed first and second reception signals, that are output from the at least one first isolating element, and to feed third and fourth reception signals, that are output from the at least one second isolating element, to a logic circuit to generate a single output signal,
wherein the at least one first isolating element includes a first isolator and a second isolator,
the at least one second isolating element includes a third isolator and a fourth isolator,
the first isolator and the third isolator are configured to receive the first transmission signal, and
the second isolator and fourth isolator are configured to receive the second transmission signal.

2. The signal transmission device according to claim 1, the logic circuit includes at least one of:
a combinational circuit configured to determine an output thereof based on a current input thereto; and
a sequential circuit configured to determine an output thereof based on current and past inputs thereto.

3. The signal transmission device according to claim 1, further comprising:
a fault indication circuit configured to generate an alarm signal indicating a fault in either of the first and second isolating elements by monitoring the first to fourth reception signals.

4. The signal transmission device according to claim 3, the fault indication circuit includes:
a first sequential circuit provided in the secondary circuit system and configured to generate a first virtual output signal from the first and second reception signals;
a second sequential circuit provided in the secondary circuit system and configured to generate a second virtual output signal from the third and fourth reception signals;
a signal comparator provided in the secondary circuit system and configured to compare the first and second virtual output signals to thereby generate a comparison signal;

a third isolating element configured to transmit the comparison signal from the secondary circuit system to the primary circuit system; and an alarm signal generator provided in the primary circuit system and configured to generate the alarm signal according to the comparison signal fed thereto via the third isolating element.

5. The signal transmission device according to claim 1,
the transmitter is configured to vary an amplitude of the first transmission signal and the second transmission signal according to the input signal.

6. The signal transmission device according to claim 5,
the transmitter includes a modulator configured to perform ASK (amplitude-shift keying) modulation.

7. The signal transmission device according to claim 5,
the transmitter includes a modulator configured to perform OOK (on-off keying) modulation.

8. The signal transmission device according to claim 1, wherein a first chip on which circuit elements of the primary circuit system are integrated, a second chip on which circuit elements of the secondary circuit system are integrated, and at least one third chip on which the first and second isolating elements are integrated are sealed in a single package.

9. The signal transmission device according to claim 8,
the first and second isolating elements are both integrated in a consolidated manner on a single chip as the third chip.

10. The signal transmission device according to claim 8,
the first and second isolating elements are integrated in a distributed manner on a plurality of chips as the third chips respectively.

11. The signal transmission device according to claim 10,
the plurality of third chips all have an identical structure.

12. The signal transmission device according to claim 1,
the first and second isolating elements are all transformers, capacitors, or photocouplers.

13. An electronic device comprising:

a power transistor; and a gate driver IC configured to drive a gate of the power transistor, wherein the gate driver IC is the signal transmission device according to claim 1.

14. A vehicle comprising the electronic device according to claim 13.

* * * * *